(12) United States Patent
Nakanishi

(10) Patent No.: US 10,908,724 B2
(45) Date of Patent: Feb. 2, 2021

(54) DISPLAY DEVICE

(71) Applicant: Japan Display Inc., Tokyo (JP)

(72) Inventor: Takayuki Nakanishi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/573,247

(22) Filed: Sep. 17, 2019

(65) Prior Publication Data

US 2020/0012374 A1 Jan. 9, 2020

Related U.S. Application Data

(63) Continuation of application No. 15/629,943, filed on Jun. 22, 2017, now Pat. No. 10,452,177.

(30) Foreign Application Priority Data

Jun. 28, 2016 (JP) .................................. 2016-127469

(51) Int. Cl.
*G06F 3/041* (2006.01)
*G06F 3/044* (2006.01)
*H01L 27/32* (2006.01)

(52) U.S. Cl.
CPC ............ *G06F 3/0412* (2013.01); *G06F 3/044* (2013.01); *H01L 27/323* (2013.01); *H01L 27/326* (2013.01); *G06F 2203/04107* (2013.01); *H01L 27/3244* (2013.01)

(58) Field of Classification Search
CPC .................. G06F 3/0412; G06F 3/044; G06F 2203/04107; H01L 27/323; H01L 27/326
See application file for complete search history.

(56) References Cited

U.S. PATENT DOCUMENTS

| 2010/0265188 | A1 | 10/2010 | Chang et al. |
| 2012/0286300 | A1 | 11/2012 | Kijima |
| 2015/0085208 | A1* | 3/2015 | Lee ....................... G06F 3/0412 349/12 |
| 2016/0132154 | A1 | 5/2016 | Lee et al. |
| 2016/0195983 | A1 | 7/2016 | Miyake |

(Continued)

FOREIGN PATENT DOCUMENTS

| CN | 105446554 A | 3/2016 |
| JP | 2011-228249 A | 11/2011 |
| JP | 2012-238544 A | 12/2012 |

OTHER PUBLICATIONS

Japanese Office Action dated Mar. 3, 2020 for the corresponding Japanese Application No. 2016-127469, with partial English machine translation retrieved from Global Dossier.

(Continued)

*Primary Examiner* — Robert J Michaud
(74) *Attorney, Agent, or Firm* — Michael Best & Friedrich LLP

(57) ABSTRACT

A display device with an input function is provided having a plurality of pixel parts arranged at intervals in a first direction and a second direction intersecting the first direction, and a display region including a plurality of light-transmitting parts arranged in the gap portions of the pixel parts, the pixel parts include at least one pixel provided with light-emitting elements, the light-transmitting part includes a sensor electrode for detecting electrostatic capacitance.

15 Claims, 24 Drawing Sheets

(56) References Cited

U.S. PATENT DOCUMENTS

2016/0247927 A1* 8/2016 Nomura .............. H01L 29/0843
2018/0143729 A1* 5/2018 Lee .................... H01L 51/5253

OTHER PUBLICATIONS

Japanese Office Action dated May 19, 2020 for the corresponding Japanese application No. 2016-127469, with partial English machine translation retrieved from EPO Global Dossier.
Japanese Notice of Termination of Reconsideration by Examiners before Appeal Proceedings dated Oct. 16, 2020 for the corresponding Japanese application No. 2016-127469, with partial English machine translation retrieved from the EPO Global Dossier.

* cited by examiner

DISPLAY DEVICE

CROSS-REFERENCE TO RELATED APPLICATIONS

This application is a continuation of U.S. patent application Ser. No. 15/629,943, filed on Jun. 22, 2017. Further, this application is based upon and claims the benefit of priority from the prior Japanese Patent Application No. 2016-127469, filed on Jun. 28, 2016, the entire contents of which are incorporated herein by reference.

FIELD

The embodiments of the present invention relate to a display device including a touch screen in which a display screen has light-transmissivity.

BACKGROUND

A display device is known in which the background view is visible through the display screen while an image is displayed on the display screen. A display device such as this is called a transparent display. A display device in which organic electroluminescence elements are used in display elements, for example, is disclosed as a transparent display (for example, Japanese Laid-Open Patent Publication No. 2011-228249 and Japanese Laid-Open Patent Publication No. 2012-238544).

Conventionally, in transparent displays, particular emphasis has been placed on development to achieve both transparency of display screens and display quality of images. However, with the expansion of the use of display devices, it is important to achieve multifunctionality while realizing thinner and lighter transparent displays. For example, when adding a touch input function to a transparent display, it is necessary to install a touch panel on the outside of the display panel, so it is conceivable that thickness will increase. Problems such as this are issues to be solved in the embodiments of the present invention.

SUMMARY

The display device with an input function according to an embodiment of the present invention has a plurality of pixel parts arranged at intervals in a first direction and a second direction intersecting the first direction, and a display region including a plurality of a light-transmitting parts arranged in gap portions of the pixel parts, the pixel parts include at least one pixel provided with light-emitting elements, the light-transmitting part includes a sensor electrode for detecting electrostatic capacitance.

The display device with an input function according to an embodiment of the present invention has a plurality of pixel parts arranged at intervals in a first direction and a second direction intersecting the first direction, and a display region including a plurality of light-transmitting parts arranged in gap portions of the pixel parts, each of the pixel parts includes at least one pixel provided with light-emitting elements, each of the plurality of light-transmitting parts includes a first sensor electrode arranged in a first direction and a second sensor electrode arranged in a second direction intersecting the first direction which detect electrostatic capacitance, the first sensor electrode and the second sensor electrode intersect sandwiching an insulator.

The display device with an input function according to an embodiment of the present invention has, between a first substrate and a second substrate, a plurality of pixel parts arranged at intervals in a first direction and a second direction intersecting the first direction, and a display region including a plurality of light-transmitting parts arranged in gap portions of the pixel parts, each of the plurality of pixel parts includes at least one pixel provided with light-emitting elements, each of the plurality of light-transmitting parts includes, between the first substrate and the second substrate, a shield electrode shielding the electromagnetic field, and a first sensor electrode and a second electrode sandwiching the shield electrode.

DESCRIPTION OF EMBODIMENTS

Hereinafter, the embodiments of the present invention will be described while referencing the drawings. However, the present invention may be implemented in many different ways, therefore interpretation should not be limited to the content exemplified in the embodiments below. In order to provide a clearer description, some components of the drawings such as the width, thickness, shape, etc. of each part are represented schematically. These drawings are merely examples and do not limit the interpretation of the present invention. In this specification and each of the drawings, elements similar to previously described elements are marked with the same symbols (numbers followed by a, b, and the like) and detailed descriptions are omitted accordingly. Furthermore, characters labeled as "first" and "second" are symbols used to distinguish each element, and do not have any further meaning unless otherwise specified.

In this specification, when certain components or regions are described as being "above" or "below" other components or regions, as long as there are no limitations, it does not necessarily mean they are directly above or below. This description includes cases in which a component or region is located higher or lower than another component or region. In other words, other components or regions are located between the component or region being described and the component or region above or below. Further, in the description below, unless otherwise noted, in a cross-sectional view, the side on which the second substrate is located with respect to the substrate will be described as "above" and the other side will be described as "below."

Embodiment 1

Figure 1A:
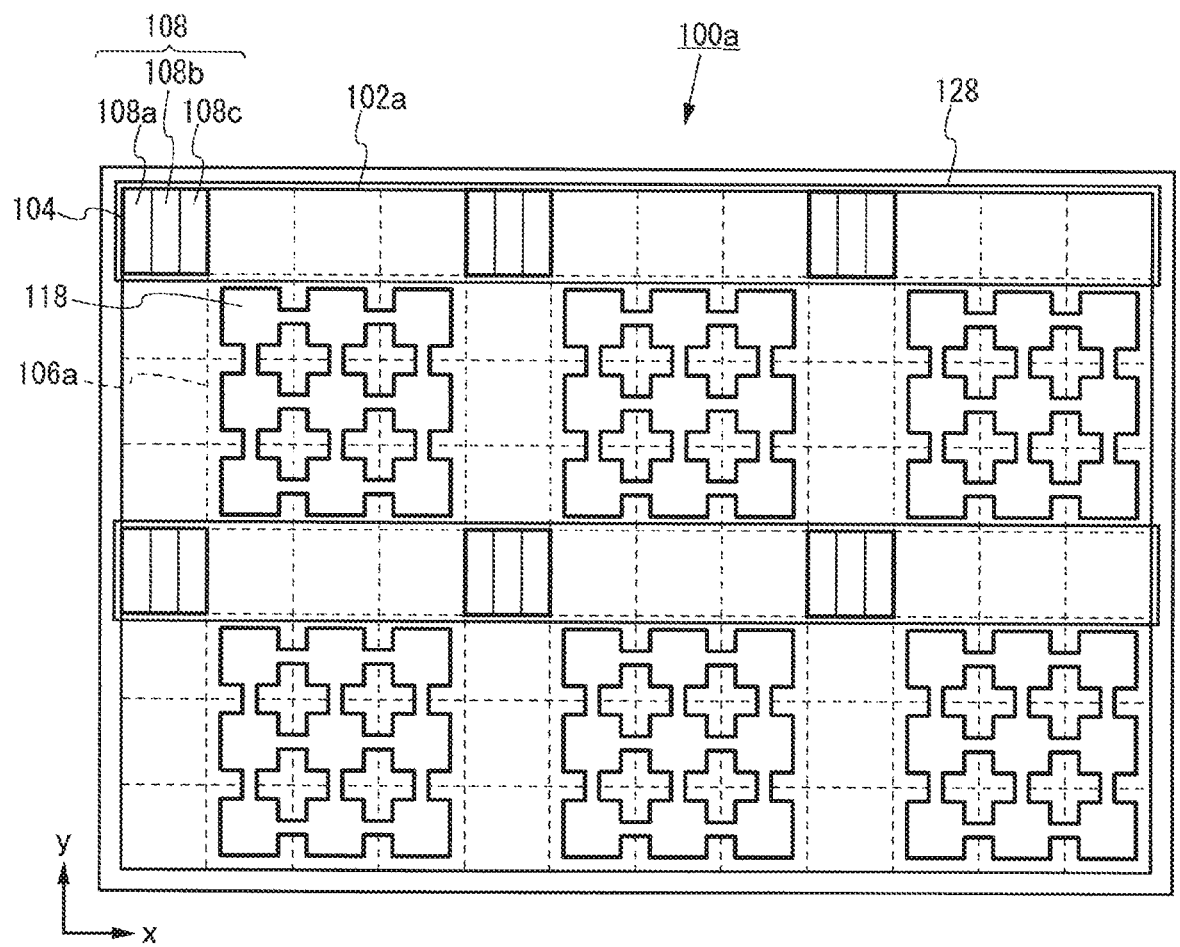
FIG. 1A is a plan view showing the structure of the display device with an input function according to an embodiment of the present invention.
Figure 2:
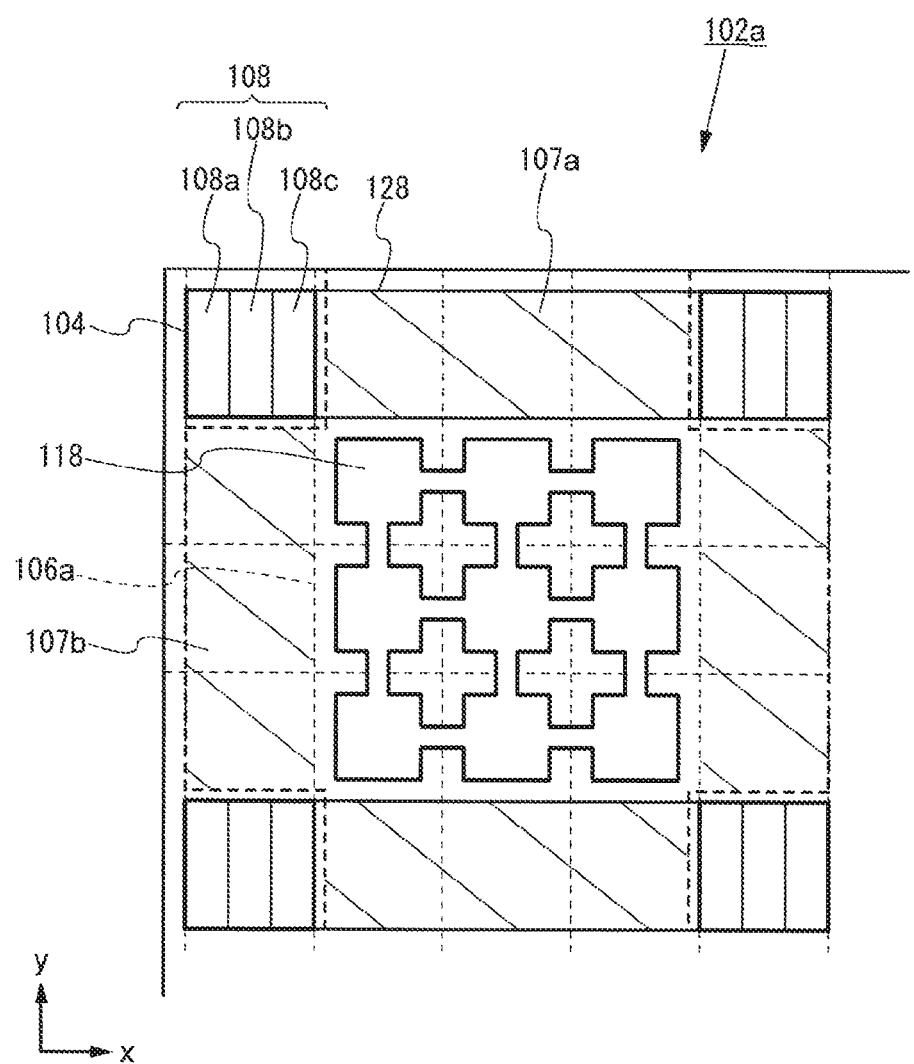
FIG. 2 is a plan view showing the detail of the display region of the display device with an input function according to an embodiment of the present invention.

FIG. 1A shows the display device with an input function 100a according to an embodiment of the present invention, FIG. 2 shows the details of the display region 102a of the display device with input function 100a. In the description below, both drawings will be referenced. The display region 102a includes a plurality of pixel parts 104. The pixel parts 104 are arranged separately in the display region 102. That is to say, a pixel part 104 and another pixel part 104 adjacent to that pixel part 104 are arranged separately. A light-transmitting part 106a is arranged between one of the pixel parts 104 and another pixel part 104. At least one pixel 108 is arranged in a pixel part 104. Further, the light-transmitting part 106a includes a region through which visible light can pass, and a sensor electrode 118 is arranged.

As is shown in FIG. 1A, a plurality of pixel parts 104 are arranged at intervals in a first direction (x direction) and a second direction intersecting the first direction (y direction intersecting the x direction in the present embodiment) in the display region 102a. The pixel part 104 has a predetermined area containing at least one pixel 108. In each array in the x direction and the y direction, the interval between a pixel part and an adjacent pixel part is such that one or a plurality of pixel parts may be inserted. For example, FIG. 1A shows an example in which the pixel parts 104 are arranged at intervals of three pixel parts in the x direction and the y direction. Further, intervals in the x direction and the y direction may be equal intervals in both directions as is shown in FIG. 1A, or may be intervals arranged at different intervals in the x direction and y direction. In the embodiments of the present invention, the arrangement of the pixel part 104 is not limited to an arrangement in which the x direction and y direction are orthogonal, and it is possible to use a structure intersecting at angles other than orthogonal.

The light-transmitting part 106a is arranged adjacent to the pixel part 104. FIG. 1A shows a state in which one light-transmitting part 106a is surrounded by four pixel parts. The light-transmitting part 106a may also be seen as a region in which pixel parts are not arranged. One pixel part 104 and one light-transmitting part 106a have the same area or different areas. Preferably, the area occupied by one light-transmitting part 106a is larger than the area of one pixel part 104. In the display region 102a, transparency increases as the total area of the light-transmitting part 106a becomes larger, and transparency decreases as the total area becomes smaller. That is to say, by changing the area ratio of the pixel part 104 and the light-transmitting part 106a, it is possible to adjust the light-transmissivity of the display region 102a. For example, by making the total area of the light-transmitting part 106a greater than the total area of the pixel part 104 in the display region 102a, visibility of the background may improve as a transparent display.

For example, in the display region 102a, the area of one light-transmitting part 106a adjacent to a pixel part 104 may be three times larger than the area occupied by one pixel part 104. The ratio of the area occupied by one pixel part 104 to the area of one light-transmitting part 106a may range from 1:3 to 1:80. Also, in terms of the ratio of the area of the pixel part to the sensor electrode 118, the area of the sensor electrode 118 provided in one light-transmitting part 106a may be one time larger than the area of one pixel part 104. Specifically, the ratio of the area of a pixel part 104 and the area of a sensor electrode 118 may range from 1:1 to 1:64. As is shown in the drawings, the ratio of the area of a pixel part 104 to the area of a sensor electrode 118 is preferably 1:9. As previously described, by adjusting the area ratio of the pixel part and the light-transmitting part, the transparency of the display region 102a may be changed. This also applies to the relationship between the area of the pixel part and the area of the sensor electrode. The greater the area ratio of the pixel part and the light-transmitting part or the pixel part and the sensor electrode becomes, the grainier the image quality becomes, but as high-definition advances it is possible to have a display which can withstand significant use without as much deterioration of image quality, even if the ratio of the area becomes larger.

As is shown in FIG. 2, an intermediate region 107a is provided between the pixel parts 104 in the x direction. Similarly, an intermediate region 107b is provided between the pixel parts 104 in the y direction. A wiring providing signals to pixels is provided in these intermediate region 107a, 107b. For example, a scan line is arranged in the intermediate region 107a, and a data line is provided in the intermediate region 107b. Since pixels are not arranged in either of the intermediate region 107a, 107b, it is possible to use them as light-transmitting parts 106a.

One pixel part 104 includes one or a plurality of pixels 108. FIG. 1A shows a state in which a first pixel 108a, a second pixel 108b, and a third pixel 108c are included in the pixel part 104. This plurality of pixels 108, for example, is arranged corresponding to an RGB color system. That is to say, the first pixel 108a is provided as a pixel corresponding to red, the second pixel 108b is provided as a pixel corresponding to green, and the third pixel 108c is provided as a pixel corresponding to blue. In the pixel part 104, a fourth pixel corresponding to white may be further provided. The display region 102a has a function for displaying images by arranging such pixel parts 104, and driving each pixel 108 of the pixel part 104 controlled by signals.

Each of the plurality of pixel parts 104 includes at least one light-emitting element. Specifically, each pixel 108 is provided with a light-emitting element. For example, the first pixel 108a is provided with a light-emitting element that emits red light, the second pixel 108b is provided with a light-emitting element that emits green light, and the third pixel 108c is provided with a light-emitting element that emits blue light. Further, a pixel 108 may be provided as a fourth pixel with a light-emitting element that outputs white light. The pixel part 104 may have a structure in which light-emitting elements outputting white light to each of the first pixels 108a, the second pixels 108b, and the third pixels 108c and color filters corresponding to each of the pixels are provided A sensor electrode 118 is provided in the light-transmitting part 106a. The sensor electrode 118 is an electrode which detects electrostatic capacitance. That is to say, the sensor electrode 118 is an electrode forming a touch sensor. The sensor electrodes 118 are arranged side by side in the region not interfering with the light-emitting element of the pixels 108. In other words, the light-emitting element and the sensor electrode are arranged adjacent to each other in a plan view. Further, the plan view directly faces the display region and shows the display surface of the display region from a normal vector direction.

FIG. 1A shows a sensor electrode 118 forming a self-capacitance type touch sensor. FIG. 1A shows an embodiment in which the sensor electrodes 118 are arranged 3×3 in a rectangular electrode pattern and are connected to each other. FIG. 1A shows an embodiment in which the sensor electrode 118 has a form in which a plurality of rectangular regions is linked, but it is not limited to this embodiment, and the shape of the sensor electrode 118 is arbitrary. For example, the sensor electrodes 118 may be formed throughout substantially the entire surface of the light-transmitting part 106a, and may have a linear pattern formed by thin metal wire. The sensor electrodes 118 are formed in a plurality of block-shaped compartments, and these block-shaped compartments are formed with substantially the same area and shape as the pixel parts 104, so it is possible that the sensor electrodes are less visible. As is shown in FIG. 1A, each block forming the sensor electrode 118 has a pattern in which adjacent parts are electrically connected, so they may be seen electrically as one electrode.

The sensor electrode 118 provided in the light-transmitting part 106a has light-transmissivity. A sensor electrode 118 such as this, for example, is formed of a transparent conductive film. Conductive metal oxides such as indium tin oxide (ITO), zinc oxide (ZnO), indium zinc oxide (IZO), and the like may be used as a transparent conductive film. Also, dispersed silver nanowires in organic resin may be used as a transparent conductive film. Further, the sensor electrode 118 uses gold, silver, aluminum, and the like, and metallic electrodes having light-transmissivity by being provided with a thinned metallic film or provided with a plurality of through-holes so as to be translucent may be applied. Alternatively, thin metallic wires or a pattern of these metallic wires (for example, a meander shape pattern) may be used as the sensor electrode 118. In any case, the sensor electrode 118 provided in the light-transmitting part 106 is formed so as to have light permeability.

Figure 1B:
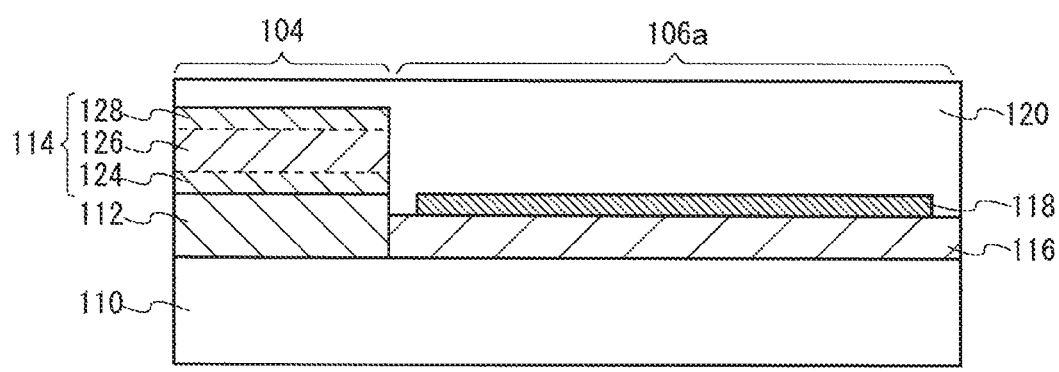
FIG. 1B is a cross-sectional view showing the structure of the display device with an input function according to an embodiment of the present invention.

FIG. 1B schematically shows the cross-sectional structure of the pixel part 104 and the light-transmitting part 106a. The pixel part 104 and the light-transmitting part 106a are provided on a light-transmitting first substrate 110. The pixel part 104 has a structure in which a circuit element layer 112 and a display element layer 114 are stacked above the first substrate 110. The circuit element layer 112 is a layer formed of a circuit (pixel circuit) which drives pixels by active devices such as transistors or passive devices such as capacitors. The circuit element layer 112 has a structure in which a semiconductor layer, an insulator, and a conductive layer are stacked. The display element layer 114 is a layer formed of display elements. The display element layer 114 includes a first electrode 124 and a second electrode 128 forming display elements, and an organic layer 126 is provided between the first electrode 124 and the second electrode 128. The potential of the first electrode 124 is individually controlled with respect to each pixel 108. On the other hand, the second electrode 128 is an electrode which provides a common potential to the display elements. The second electrode 128, as is shown in FIG. 1A, is arranged in a belt-like shape so as to be continuous in the array of pixel parts 104 in the x direction. As a different embodiment, the second electrode 128 is arranged in a banded shape so as to be continuous in the array of pixel parts 104 in the y direction. By providing a common electrode (second electrode 128) for each pixel in this way, the sensor electrode 118 which detects electrostatic capacitance and the common electrode (second electrode 128) do not overlap in a plan view.

In FIG. 1B, the light-transmitting part 106a includes an insulator 116 and a sensor electrode 118. The insulator 116 is configured including one or a plurality of insulating films. The insulating film such as silicon oxide film, silicon nitride film, or polyimide such as an organic insulating film and the like may be applied as the insulating films. Any of these insulating films are transparent to visible light. The sensor electrode 118 is provided above, below, or in the insulator 116. The pixel part 104 and the light-transmitting part 106a are further sealed by a sealant 120.

As is shown in FIG. 1A and FIG. 1B, by arranging the pixel part 104 provided with pixels 108 and the light-transmitting part 106a provided with a sensor electrode 118 forming a touch sensor side by side, or by alternately arranging the pixel parts 104 and the light-transmitting parts 106a, a touch sensor function may be added without affecting image display in the so-called transparent display.

Figure 3:
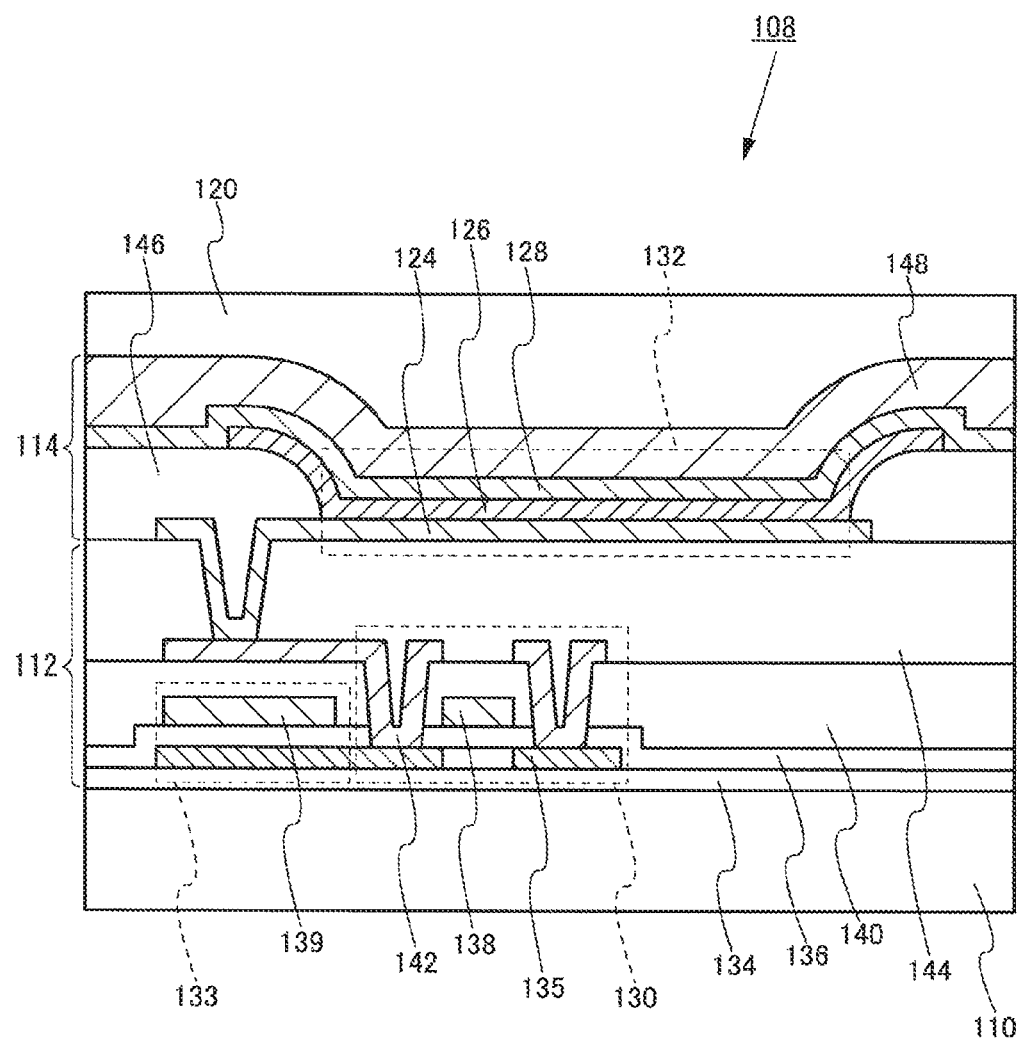
FIG. 3 is a cross-sectional view showing the structure of a pixel of the display device with an input function according to an embodiment of the present invention.

FIG. 3 shows a cross-sectional structure of the pixels 108 included in the pixel part 104. The pixels 108 include a circuit element layer 112 provided on the first side of the first substrate 110 and a display element layer 114. The sealant 120 is provided above the display element layer 114. The circuit element layer 112 includes elements such as a transistor 130 and a capacitor 133, and the display element layer 114 includes a light-emitting element 132 as a display element. The transistor 130 is configured including a semiconductor layer 135, a gate insulator 136, and a gate electrode 138. The capacitor 133, for example, is formed in a region in which the semiconductor layer 135, the gate insulator 136, and a capacitance electrode 139 overlap. In between the semiconductor layer 135 and the first substrate 110, an underlying insulator 134 may be provided as the insulator below the semiconductor layer 135. The light-emitting element 132 has a structure in which an organic layer 126 including organic electroluminescence materials is provided between the first electrode 124 and the second electrode 128. The first electrode 124 is electrically connected to the transistor 130 via the source/drain electrode 142.

A first insulator 140 is provided between the gate electrode 138 and the source/drain electrode 142 in the circuit element layer 112. A second insulator 144 is provided between the source/drain electrode 142 and the first electrode 124. The first insulator 140 and the second insulator 144 have a function as an interlayer insulating film which insulates wiring or between elements. The first insulator 140 is formed of inorganic insulating materials, and the second insulator 144 is formed of organic insulating materials. The second insulator 144 has a planarization film mechanism for planarizing the underlying surface of the light-emitting element 132.

Plate-like members such as glass substrates and plastic substrates, or film substrates having flexibility such as an organic resin film are applicable as the first substrate 110. The semiconductor layer 135 is formed of silicon-based semiconductor materials such as crystalline silicon (polycrystalline silicon) and amorphous silicon, and metallic oxide showing semiconductor properties (so-called oxide semiconductor). The underlying insulator 134, the first insulator 140, and the gate insulator 136 are formed of inorganic insulating materials such as silicon oxide, silicon nitride, and silicon oxynitride, and the second insulator 144 is formed of organic insulating materials such as polyimide and acrylic.

In the display element layer 114, the end portion of the first electrode 124 is covered by an insulating third insulator 146. In other words, the first electrode 124 is exposed at the opening of the third insulator 146, and the organic layer 126 is provided in the region in which the first electrode 124 is exposed. In the pixel part 104, the organic layer 126 is formed including different materials for each pixel. For example, when the organic electroluminescence material is formed of guest/host materials, combinations of the guest/host materials are selected according to the emission color of each pixel. In order to be connected to the light-emitting elements of adjacent pixels, the second electrode 128 is provided so as to cover the organic layer 126 and the third insulator 146. Further, the second electrode 128 is provided so as to be continuous between the adjacent pixel parts 104 as is shown in FIG. 1A. A fourth insulator 148 in which a nitride silicon film or a nitride silicon film and an organic insulating film are stacked above the second electrode 128. The light-emitting element 132 emits light by controlling the potential of the first electrode 124 and the second electrode 128 and applying a higher voltage than the light-emitting threshold value voltage. The electric potential applied to the first electrode 124 and the current flowing in the light-emitting elements are controlled by the transistor 130.

An underlying insulator 134, a gate insulator 136, a first insulator 140, and a second insulator 144 included in the circuit element layer 112, and a third insulator 146 and fourth insulator 148 included in the display element layer 114 expand to the light-transmitting part 106. These insulators are used as the insulator 116 in the light-transmitting part 106. The sensor electrode 118 is formed in the same layer as first electrode 124 or the second electrode 128 of the display element layer 114.

Figure 4:
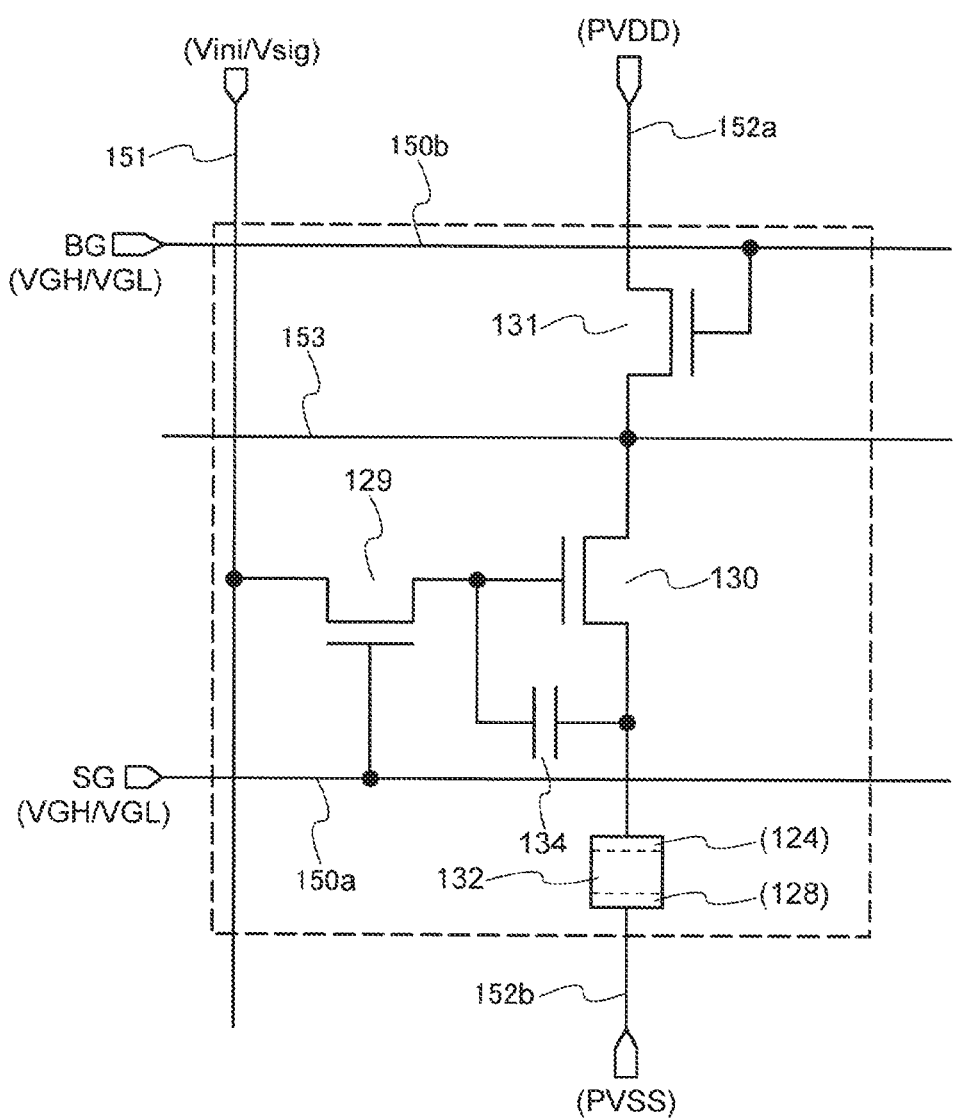
FIG. 4 is a figure showing the equivalent circuit of a pixel of the display device with an input function according to an embodiment of the present invention.

FIG. 4 shows an example of an equivalent circuit (hereinafter referred to as "pixel circuit") of the pixels 108 having a structure such as this. The pixel circuit includes a transistor 130, a light-emitting element 132, a first switch 129, a second switch 131, and a capacitor 133. In the light-emitting element 132, the first electrode 124 is connected to a first power wire 152a via the transistor 130. A second power wire 152b controls the potential of the second electrode 128. A high-voltage PVDD is provided in the first power wire 152a, and a low-voltage PVSS with a lower voltage than the high-voltage PVDD is provided in the second power wire 152b. The first switch 129 and the second switch 131 are three terminal switching devices, and are preferably formed of transistors.

The transistor 130 has a gate as a control terminal and a source and drain as an input-output terminal. One of the input-output terminals corresponding to the source and the drain of the transistor 130 is electrically connected to the first power wire 152a via the second switch 131. The other input-output terminal corresponding to the source and drain of the transistor 130 is electrically connected to the first electrode 124. The gate of the transistor 130 is electrically connected to the data line 151 via the first switch 129. The first switch 129 is controlled by an on/off operation by a control signal SG (having an amplitude VGH/VGL) provided by the first scan line 150a. The control signal VGH is a high-potential signal which turns on the first switch 129, and the control signal VGL is a low-potential signal which turns off the first switch 129. When the first transistor 130 is on, the potential of the data line 151 is provided by the gate of the transistor 130. It is assumed that the transistor 130 is an n-channel type transistor in the pixel circuit in FIG. 4. In the transistor 130, it is assumed that the input-output terminal on the side electrically connected to the first power wire 152a is the drain, and the input-output terminal on the side electrically connected to the light-emitting element 132 is the source.

The capacitor 133 is provided between the source and gate of the transistor 130. The gate potential of the transistor 130 is controlled by the capacitor 133. The intensity of luminescence of the light-emitting element 132 is controlled by the drain current of the transistor 130. A voltage is applied to the gate of the transistor 130 based on the data signal, and when the second switch 131 is turned on by the scan signal provided from the second scan line 150b, the drain of the transistor 130 is connected to the first power line 152a, and the drain current flows to the light-emitting element 132. In this way, the light-emitting element 132 emits light in response to the drain current. Further, the potential of the gate and source of the transistor 130 is initialized for every frame by an initialization signal provided by the data line 151 and the reset voltage applied by the reset signal line 153.

In one embodiment of the present embodiment, both the first electrode 124 and the second electrode 128 are formed by transparent conductive films. In this way, it is possible to display an image on both sides of the display region 102. As another embodiment, it is possible to display an image on one side of the display region 102 when either the first electrode 124 or the second electrode 128 is formed of a metallic film and the other is formed of a transparent conductive film. Further, as another example, a plurality of pixel parts 104 are split into two types. When in the first type of light-emitting element, the first electrode is formed of a metallic film and the second electrode is formed of a transparent conductive film, and in the second type of light-emitting element, the first electrode is formed of a transparent conductive film and the second electrode is formed of a metallic film, different images may be visually displayed at the same time on either side of the display region 102.

Figure 5:
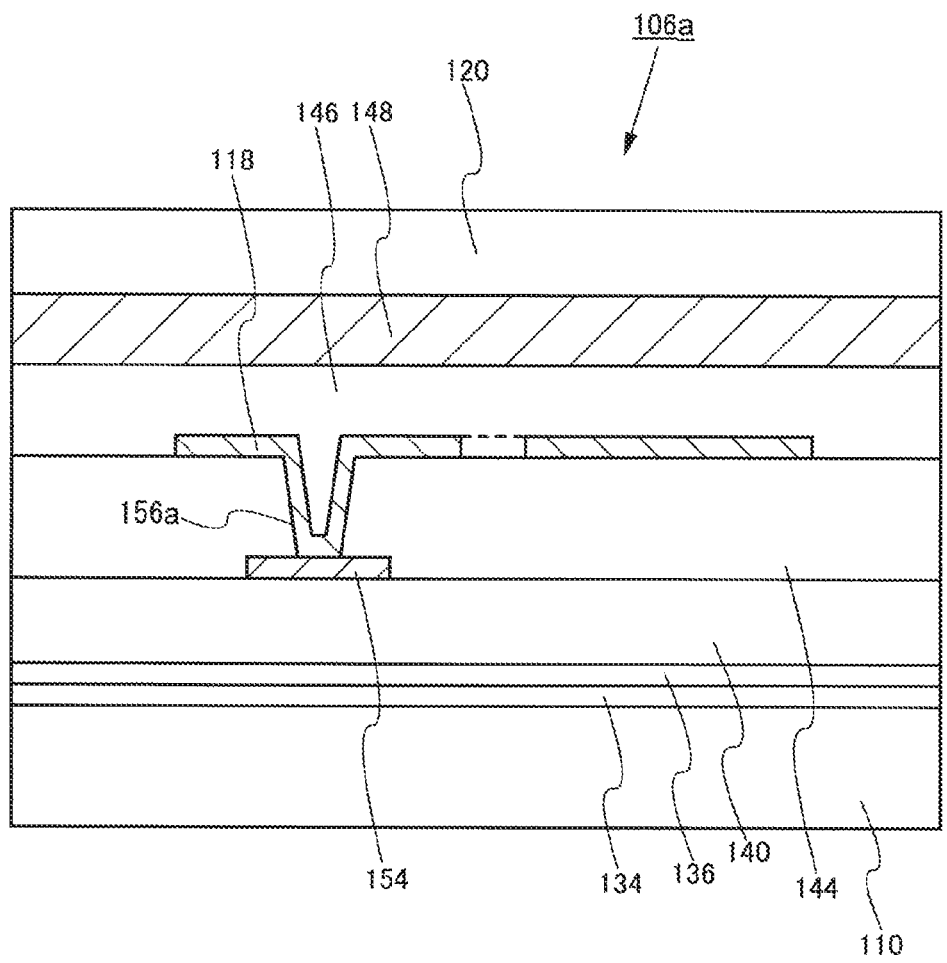
FIG. 5 is a cross-sectional view showing the structure of a light-transmitting part in the display region of the display device with an input function according to an embodiment of the present invention.

FIG. 5 shows a cross-sectional structure of a light-transmitting part 106a. The light-transmitting part 106a is provided with a sensor electrode 118. Below the sensor electrode 118, for example, an underlying insulator 134 provided extending from a pixel part 104, a gate insulator 136, a first insulator 140, and a second insulator 144 are provided. A third insulator 146 and a fourth insulator 148 may be provided above the sensor electrode 118. The sensor electrode 118 detects changes in electrostatic capacitance, so it still operates as an electrode for a touch sensor even if it is covered by an insulator. By covering an insulator such as this above or below, the sensor electrode 118 is protected without being exposed to an outside portion. In other words, by appropriately using an insulator forming the pixel part 104, it can be used as a protection film of the sensor electrode 118. Further, these insulators have light-transmissivity with respect to visible light, so even if they are provided in the light-transmitting part 106, there is no possibility that light-transmissivity will significantly decrease.

A detection wiring 154 is provided in a different layer than the sensor electrode 118. The detection wiring 154 is provided as a wiring for detecting the potential of the sensor electrode 118. The detection wiring 154 is, for example, provided between the first insulator 140 and the second insulator 144. Although is not illustrated the detection wiring may be provided between the gate insulator 136 and the first insulator 140. The detection wiring 154 may be formed by the same layer as the conductive layer forming the gate electrode or the same layer as the conductive layer forming the wiring (source/drain electrode 142) connected to the source or the drain of the transistor 130. That is to say, by patterning the same layer as the gate electrode 138 and the source/drain electrode 142 and forming the detection wiring 154, the layer structure may be simplified and manufacturing costs may decrease.

In the example shown in FIG. 5, the sensor electrode 118 is electrically connected to the detection wiring 154 via a contact hole 156a provided in the second insulator 144. Since the sensor electrode 118 is provided so as to expand over substantially the entire surface of the light-transmitting part 106, it is possible to increase electrostatic capacitance and increase detection sensitivity. Because the sensor electrode 118 preferably has light-transmissivity, it is formed of transparent conductive films such as ITO, ZnO, IZO, and the like. Because the sensor electrode 118 is formed of a transparent conductive film, the detection wiring 154 is formed of a metallic film, so even if the area of the display area 102 becomes greater, the influence of signal delay caused by interconnection resistance and the like may be reduced.

Figure 6:
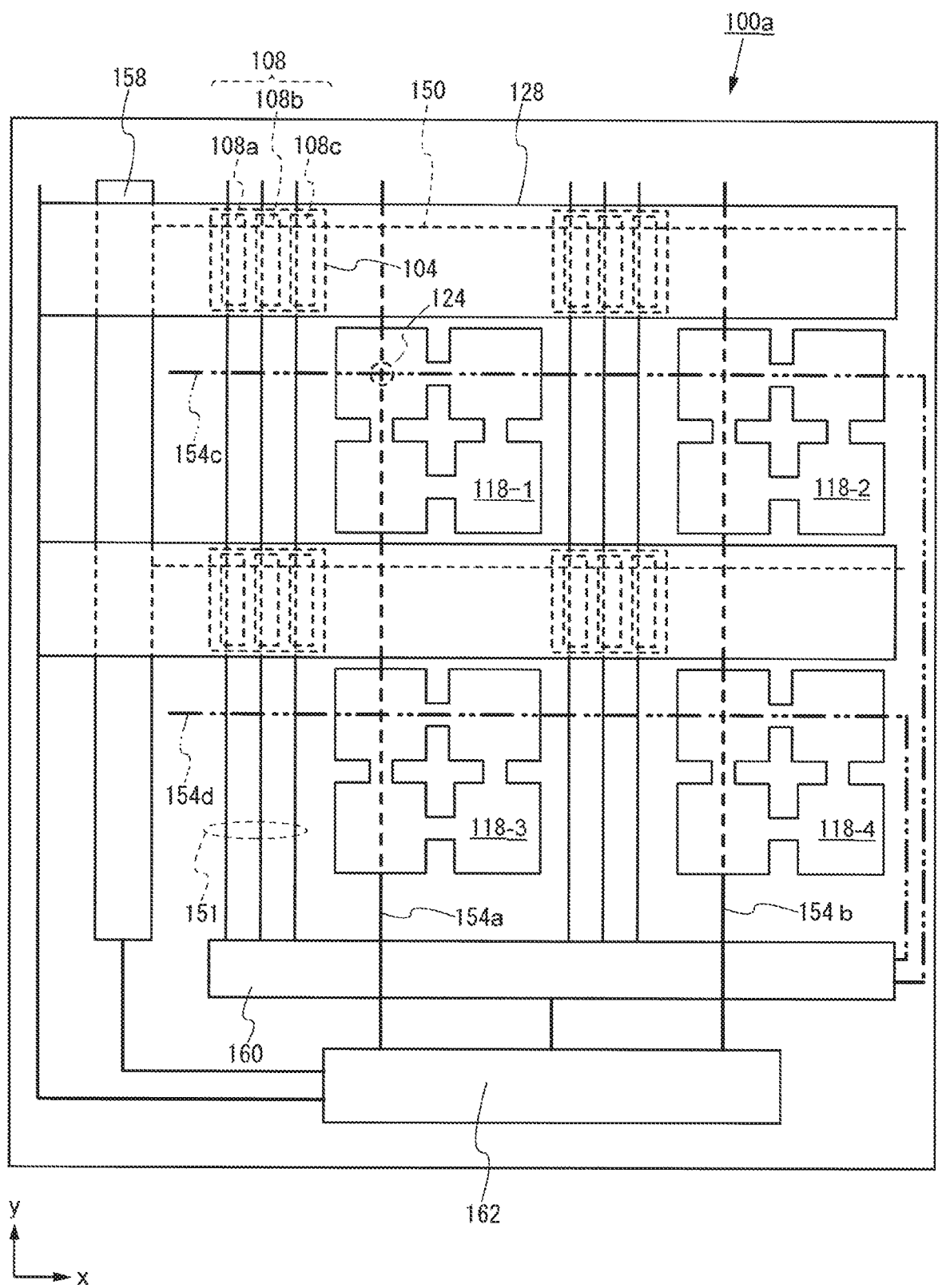
FIG. 6 is a cross-sectional view showing the structure of the display device with an input function according to an embodiment of the present invention.

FIG. 6 shows the wiring structure of the drive circuit and the display region provided in the display device with an input function 100a. A vertical drive circuit 158, a horizontal drive circuit 160, and a controller circuit 162 are included as the drive circuit. The vertical drive circuit 158 outputs scan data signals to the scan line 150 and the horizontal drive circuit 160 includes a selection circuit for selecting the data line 151. The controller circuit 162 outputs a data signal to the horizontal drive circuit 160, and outputs a synchronizing signal to the vertical drive circuit 158. The controller circuit 162 is connected to the detection wiring 152, and controls the operation of the touch sensor. Further, the controller circuit 162 has a function for controlling the potential of the second electrodes provided continuously throughout the plurality of pixel parts 104.

The scan line 150 is arranged along the array of pixel parts 104 in the x direction. The data line 151 is arranged along the array of pixel parts 104 in the y direction. The detection wiring 154 (154a, 154b) is arranged substantially parallel to the data line 151. The detection wiring 154a, 154b may be formed by the same conductive layer as the data line 151. The pixel parts 104 are arranged separately in the x direction, so even if they are applied to the same layer structure as the data line 151 and the detection wiring 154a, it is possible to provide them separately from each other. The sensor electrode 118 and the detection wiring 154a, 154b sandwich the insulator and are provided in different layers. For example, when the detection wiring 154a, 154b is provided in the same layer as the data line 151, and the sensor electrode 118 is formed by the first electrode 124 or the second electrode 128, the sensor electrode 118 is arranged above the detection wiring 154a, 154b. In this case, the detection wiring 154a, 154b is electrically connected to the sensor electrode 118 via the contact hole 156 provided in the insulator arranged between the detection wiring 154a, 154b and the sensor electrode 118. In this way, the display region 102 includes a scan line and a data line transmitting signals to the plurality of pixel parts 104, and a detection wiring connected to the sensor electrodes arranged parallel to the scan line and the data line. Further, the embodiments of the present invention are not limited to an embodiment in which the detection wiring 154 is arranged parallel to the data line 151. For example, as is shown by a dotted line in FIG. 6, the detection wiring 154c, 154d may be provided parallel to the scan line 150. In this case, the detection wiring 154a, 154b may be formed by the same conductive layer as the scan line 150. The pixel parts 104 are separately arranged in the y direction, so even if the scan line 150 and the detection wiring 154c, 154d are formed in the same conductive layer, it is possible to provide them separately from each other.

Further, in the touch sensor, one sensor electrode 118 may be connected to one detection wiring 154, and one detection wiring 154 may be connected to a plurality of sensor electrodes 118. One detection wiring 154 is connected to the sensor electrode 118, so a group of the plurality of sensor electrodes 118 may be used as a self-capacitance electrode in the touch sensor. For example, the sensor electrodes 118_1, 118_2, 118_3, and 118_4 may be electrically connected to the detection wiring 154a. In this case, the sensor electrodes 118_1, 118_2, 118_3, and 118_4 may be electrically connected so as to have the same potential. For example, the sensor electrodes 118 may be connected by wiring provided in the same layer as the scan line provided below, and the pattern of the sensor electrode 118 itself may have a continuous shape so as to be electrically connected to adjacent sensor electrodes. In other words, sensor electrodes 118 are arranged in each of the plurality of light-transmitting parts 106 including regions in which adjacent sensor electrodes are electrically connected to each other. These connection regions, for example, may be regions corresponding to the intermediate region 107a, 107b shown in FIG. 2. In this way, the detection wiring 154 is connected to the plurality of sensor electrodes 118, so the plurality of sensor electrodes 118 may be seen and treated as virtually one sensor electrode. In other words, without changing the pattern of the sensor electrode 118, the area of one sensor electrode may be adjusted depending on the number of connections with the detection wiring 154.

Figure 7:
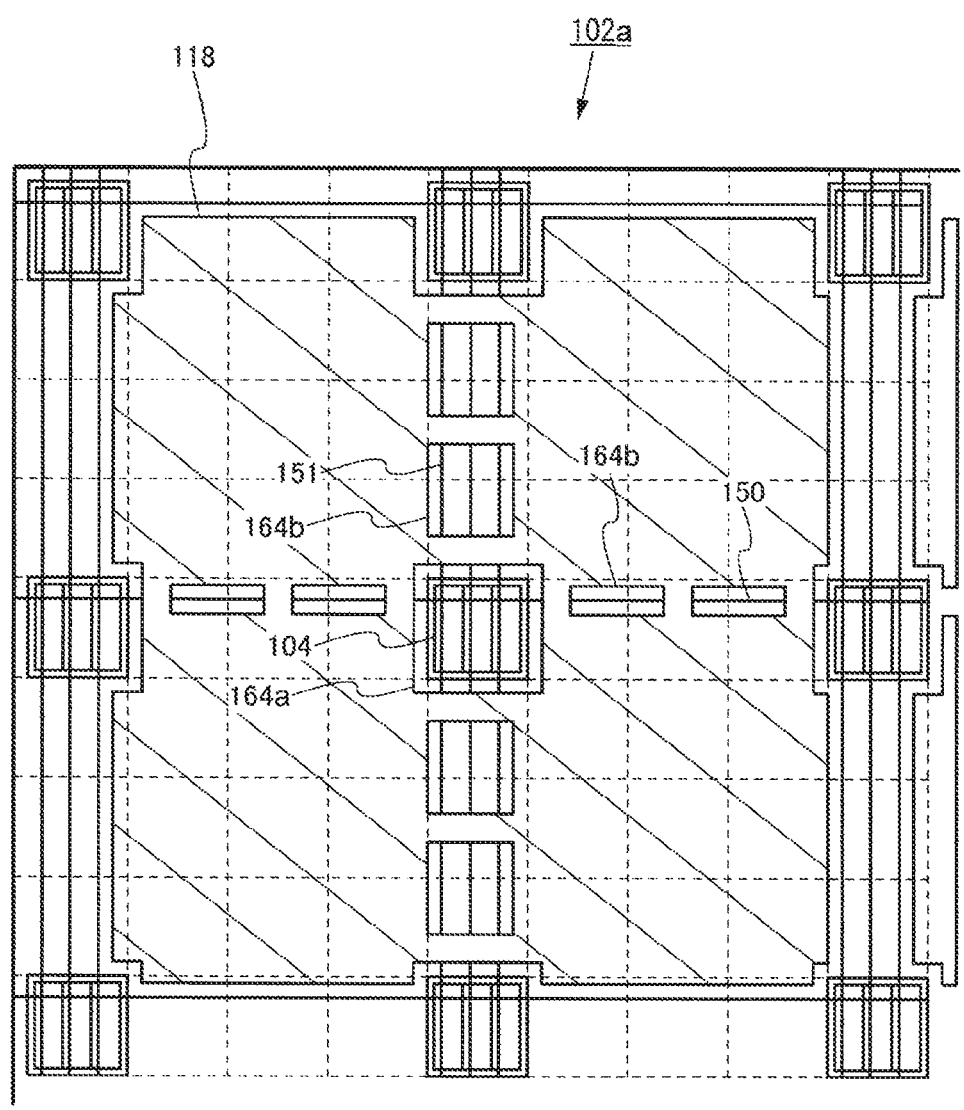
FIG. 7 is a plan view showing the structure of the display region of the display device with an input function according to an embodiment of the present invention.

In addition, as is shown in FIG. 7, the sensor electrodes 118 are provided throughout a plurality of light-transmitting parts so as to surround one pixel part 104 among a plurality of pixel parts, and may have an opening 164a opening the pixel part 104. In other words, adjacent sensor electrodes may be electrically connected to each other. By a shape such as this, the area of the sensor electrode 118 may be larger. In this case, the region overlapping the scan line 150 and the data line 151 is preferably provided with an opening 164b. With the opening 164b, the occurrence of parasitic capacitance between the sensor electrode 118, the scan line 150, and the data line 151 may be reduced. In either case, the intervals at which the sensor electrodes are arranged may be larger than the intervals at which the pixel parts 104 are arranged, so the plurality of sensors may be collectively used as one sensing electrode depending on the resolution required by the touch sensor.

FIG. 6 shows a self-capacitance type touch sensor. In a self-capacitance type touch sensor, the sensor electrode 118 has self-capacitance (for example, parasitic capacitance occurring between a sensor electrode and a peripheral member). When the body (fingertip, etc.) gets close to the touch surface, electrostatic capacitance occurs between the sensor electrodes 118, and the electrostatic capacitance which occurs in the sensor electrode 118 changes. The self-capacitance detection type touch sensor detects the proximity of the body (fingertips, etc.) by measuring the change of electrostatic capacitance from when there is no touch to when there is touch. The self-capacitance type has the benefit of a simple electrode structure.

In this way, according to the principle of self-capacitance type touch sensors, it is possible for the display device with an input function 100a according to the present embodiment to detect touch from one side or the other side of the display region 102.

According to the present embodiment, in the display region, a light transmitting part is provided between gap portions of the pixel parts arranged so as to display images, and a sensor electrode forming a touch sensor is provided in the light-transmitting part, so a touch sensor function may be added to a display device. In other words, without externally attaching a member as a touch sensor, an input function may be added to a display device. In this way, it is possible to aim for a thinner, lighter, and lower-cost display device with an input function.

Further, the display device according to the present embodiment may be a transparent display by providing a light-transmitting part in addition to the pixel part in the display region. By providing a sensor electrode 118 forming a touch sensor in the light-transmitting part, it is possible to use both sides of the display region as a touch sensor surface. Also, by placing pixels and sensor electrodes side by side, it is possible for the touch sensor to be built into the display device without affecting image quality.

Embodiment 2

The present embodiment exemplifies a structure as the display device with an input function in which it is possible to detect touch from one side of the display region. In the description below, aspects different from embodiment 1 will be mainly described.

Figure 8A:
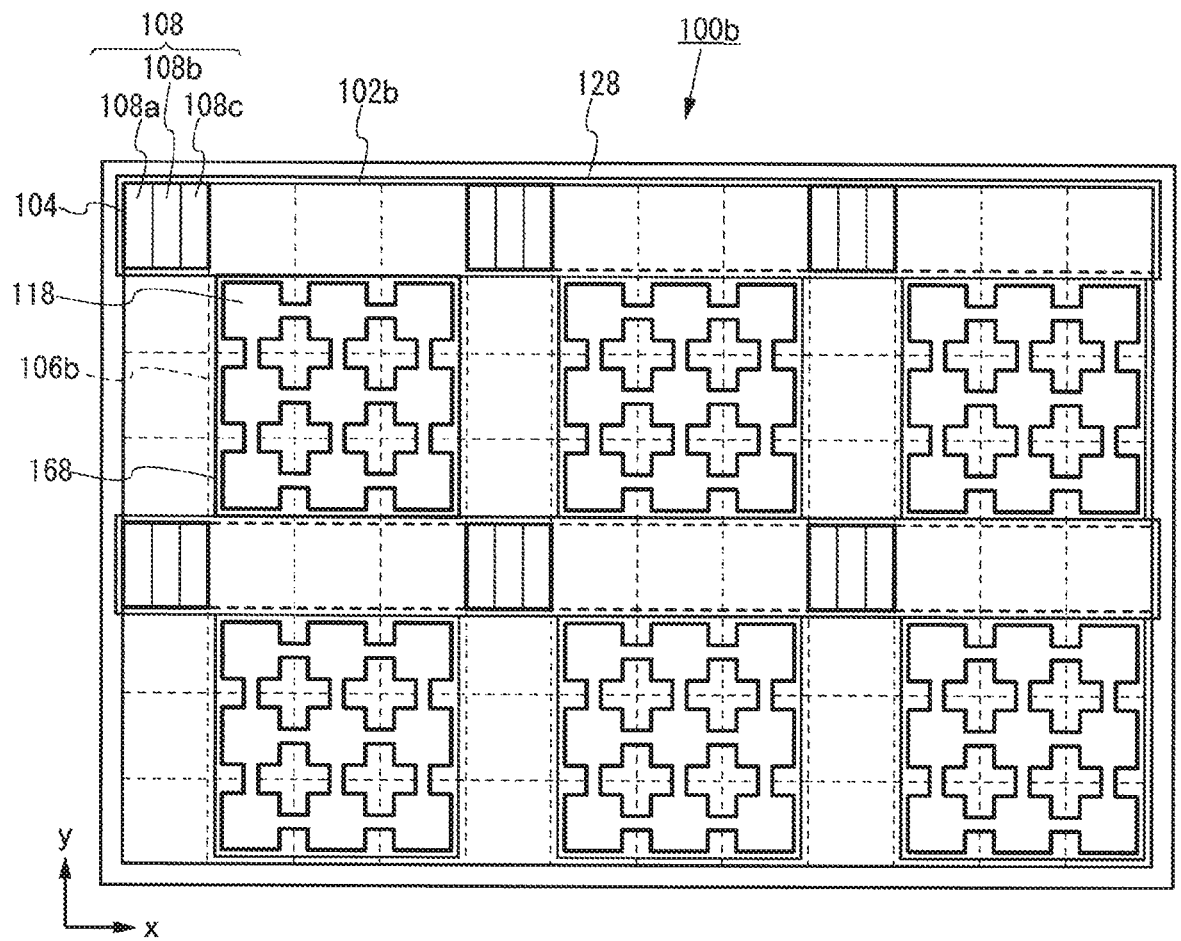
FIG. 8A is a plan view showing the structure of the display device with an input function according to an embodiment of the present invention.
Figure 8B:
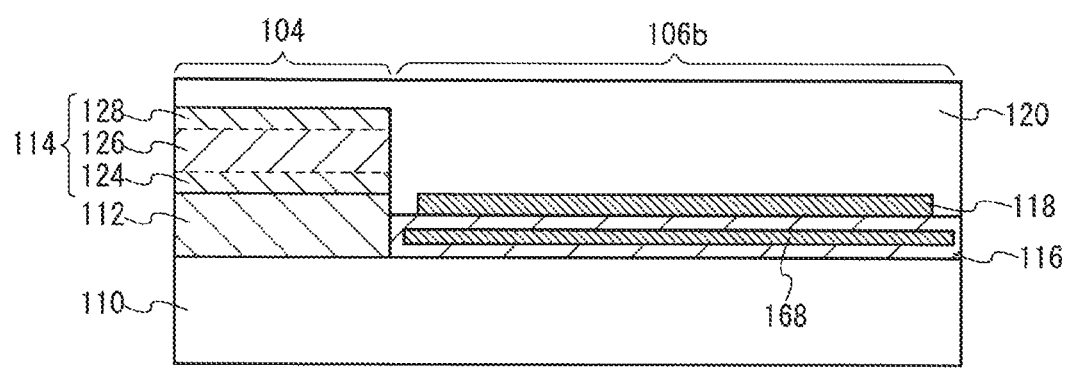
FIG. 8B is a cross-sectional view showing the structure of the display device with an input function according to an embodiment of the present invention.

FIG. 8A, according to the present embodiment, shows a plan view of the display device with an input function 100b provided with a self-capacitance type touch sensor. The display device with an input function 100b shown in FIG. 8A and FIG. 8B is different from that of embodiment 1 in that it is provided with a shield electrode 168 which overlaps the sensor electrode 118 and shields the electromagnetic field. The shield electrode 168 has an area covering at least the entire sensor electrode 118, and is provided on one side of the sensor electrode 118. FIG. 8B schematically shows the cross-sectional structure of the pixel part 104 and the light-transmitting part 106b. The shield electrode 168, for example, is provided so as to be embedded in the insulator 116. Further, the shield electrode 168 may be provided so as to correspond to each sensor electrode 188, and the shield electrode 168 provided corresponding to each sensor electrode 118 may be provided so as to connect to corresponding shield electrodes.

By fixing the shield electrode 168 at a constant potential (for example, ground potential), on the surface of the side on which the shield electrode 168 is provided, the sensor electrode 118 cannot detect the change of electrostatic capacitance. The potential of the shield electrode 168 may fluctuate between predetermined potentials. For example, a potential may fluctuate in response to operations of the sensor electrode 118, so it is possible to use a structure in which a potential fluctuates by inputting the same signal as the sensor signal input into the sensor electrode 118 in the same phase. For example, the sensor electrode 118 may be driven so the potential fluctuates during the sensing operation and non-operation of the touch sensor.

The shield electrode 168 allows the touch surface of the touch sensor to be provided on only one side of the display region 102b. In this way, the display device with an input function 100b which can react only to touch from one side is realized.

Figure 9:
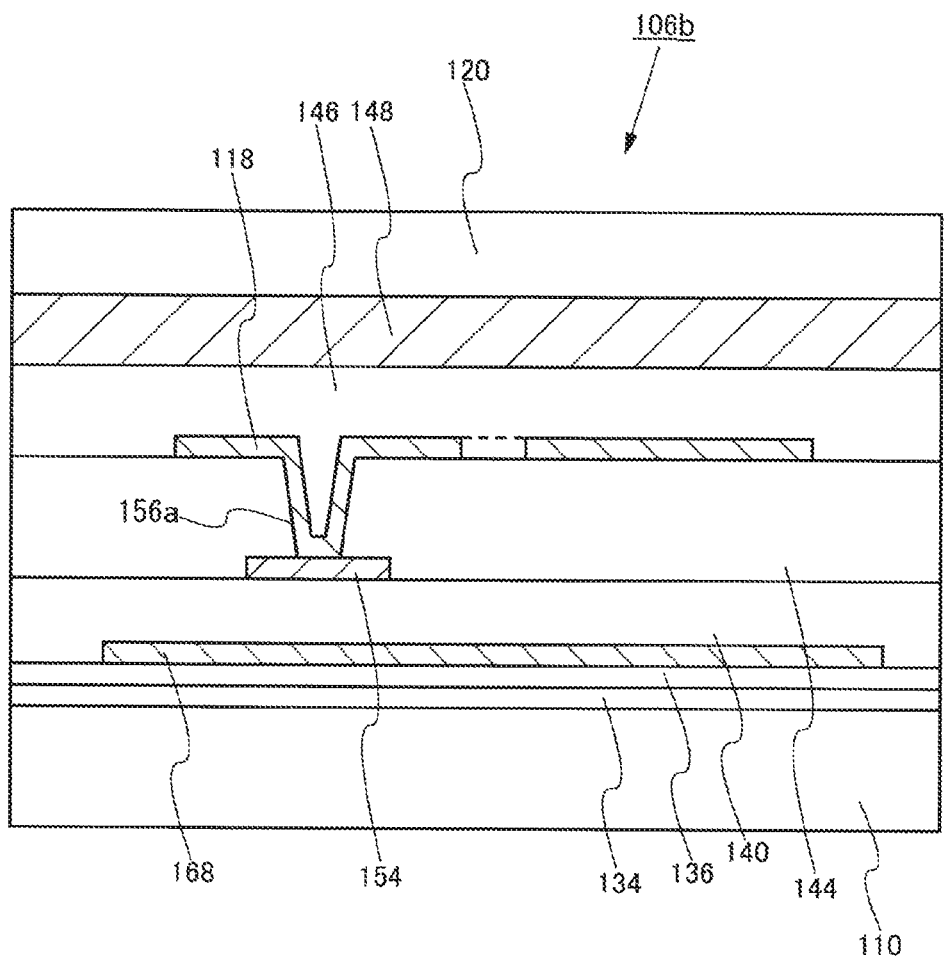
FIG. 9 is a cross-sectional view showing the structure of a light-transmitting part in the display region of the display device with an input function according to an embodiment of the present invention.

FIG. 9 shows the details of the cross-sectional structure of such a light-transmitting part 106b. The shield electrode 168 is provided between the gate insulator 136 and the first insulator 140. In this case, the shield electrode 168 may be formed by the same conductive layer as the gate electrode 138. The gate electrode 138 is formed of metallic materials such as molybdenum, tungsten, aluminum, and the like, so in this case, the shield electrode 168 is preferably formed in a grid shape, comb-tooth shape, or mesh shape pattern. That is to say, it preferably has a shape in which a plurality of openings penetrating the in-plane of the shield electrode 168 formed of a metallic film are provided, and has light permeability. The shield electrode may be formed of a transparent conductive film such as ITO, ZnO, IZO, and the like. In either case, the shield electrode 168 is provided so as to have light-transmissivity, so while maintaining visibility through to the back side by the light-transmitting part 106b, it is possible to make the touch side of the touch sensor only on one side.

Figure 10:
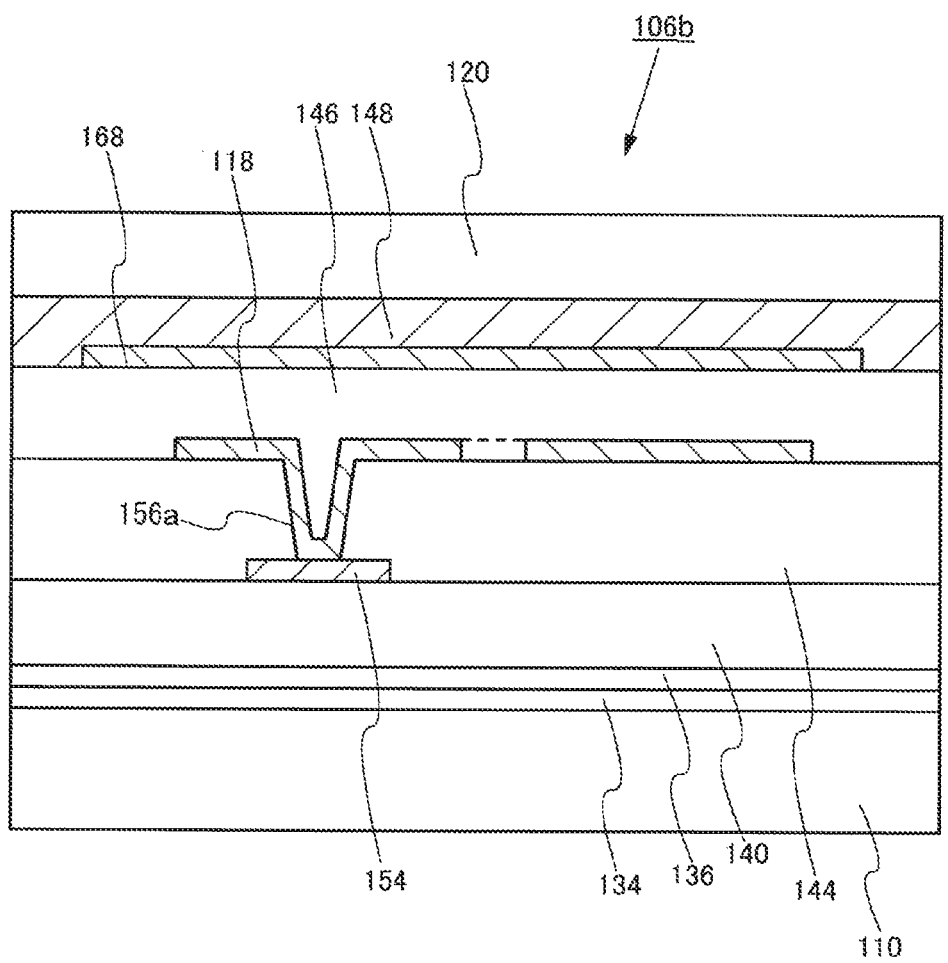
FIG. 10 is a cross-sectional view showing the structure of a light-transmitting part in the display region of the display device with an input function according to an embodiment of the present invention.

Further, although FIG. 9 exemplifies a structure in which the shield electrode 168 is provided between the gate insulator and the first insulator 140, the present embodiment is not limited to this. If the shield electrode 168 is provided in a location not interfering with the sensor electrode 118 and the detection wiring 154 (that is to say, a location not electrically touching the sensor electrode 118 and the detection wiring 154), it may be provided in another region. For example, it may be provided between the underlying insulator 134 and the gate insulator, or between the first substrate 110 and the underlying insulator 134. As shown in FIG. 10, the shield electrode 168 may be formed by the same conductive layer as the second electrode 128 above the third insulator 146.

Figure 11:
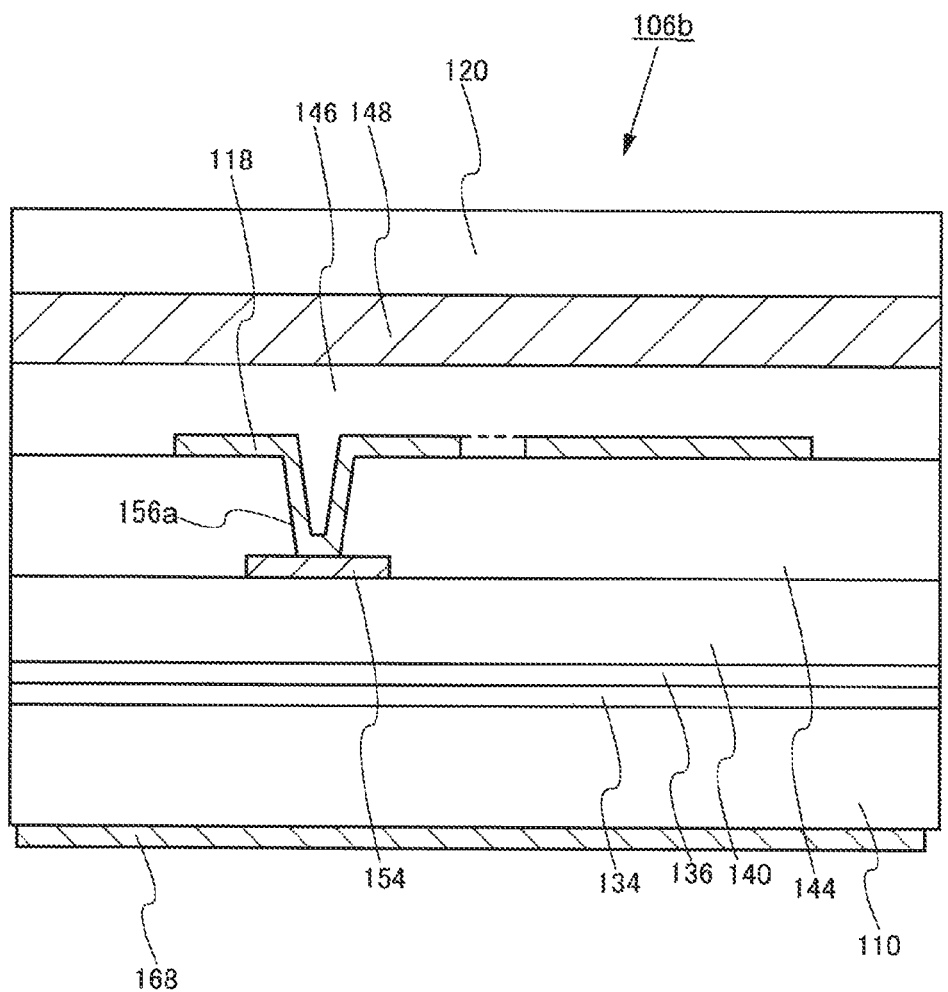
FIG. 11 is a cross-sectional view showing the structure of a light-transmitting part in the display region of the display device with an input function according to an embodiment of the present invention.

In addition, as is shown in FIG. 11, the shield electrode 168 is provided on the second side on the opposite side of the first side of the first substrate 110 on which the circuit element layer 112 and the display element layer 114 are provided. In this case, the shield electrode 168 is provided in the region overlapping at least the light transmitting part 106. Because the shield electrode 168 is provided on the second side of the first substrate 110, it is possible to securely prevent the sensor electrode 118 from reacting to touch from the second side.

According to the present embodiment, by providing a shield electrode 168 on one side of the sensor electrode 118, it is possible to install a touch surface of the touch sensor on one side. In this case, in the display region 102, the pixel part 104 and the light-transmitting part 106b are arranged in different regions from each other, so even if a shield electrode 168 is provided, it is possible to prevent any influence on the image display. The potential of the shield electrode 168 may synchronize with the detection operation of the sensor electrode 118 and fluctuate, so the sensitivity of the touch sensor may improve.

Embodiment 3

The present embodiment exemplifies a structure as the display device with an input function in which the embodiment of the light-transmitting part is different from that of embodiment 1. In the description below, aspects different from embodiment 1 will be mainly described.

Figure 12A:
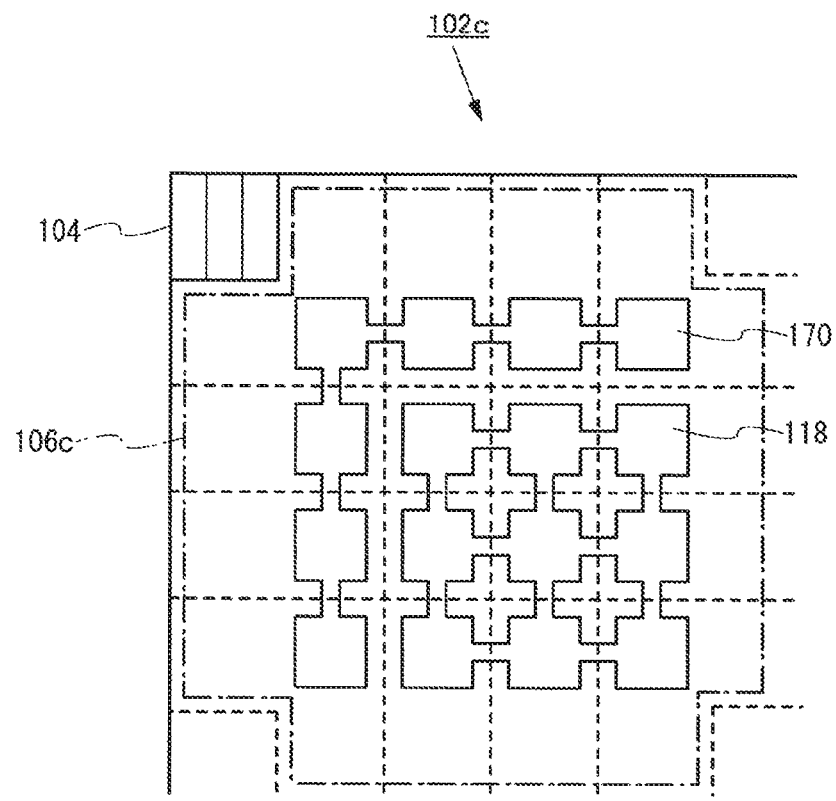
FIG. 12A is a plan view showing the structure of the display device with an input function according to an embodiment of the present invention.

FIG. 12A shows an embodiment of a pixel part 104 and a light-transmitting part 106c in a display region 102c. Here, the structure of the pixel part 104 is the same as that of embodiment 1. The light-transmitting part 106c includes a sensor electrode 118 and an adjacent shield electrode 170.

Figure 12B:
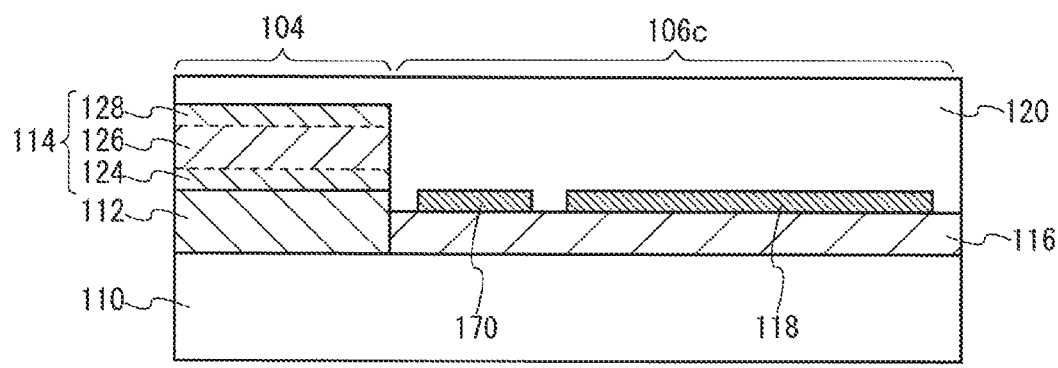
FIG. 12B is a cross-sectional view showing the structure of the display device with an input function according to an embodiment of the present invention.

The adjacent shield electrode 170 are provided so as to surround the sensor electrodes 118. FIG. 12B schematically shows the cross-sectional structure of such a light-transmitting part 106c. In the light-transmitting part 106c, the sensor electrode 118 and the adjacent shield electrode 170 are arranged side by side. Further, although FIG. 12B shows an embodiment in which the sensor electrodes 118 and the adjacent shield electrode 170 are arranged in the same layer as the insulator 116, the present embodiment is not limited to this, and both electrodes may be provided in different layers.

Figure 13:
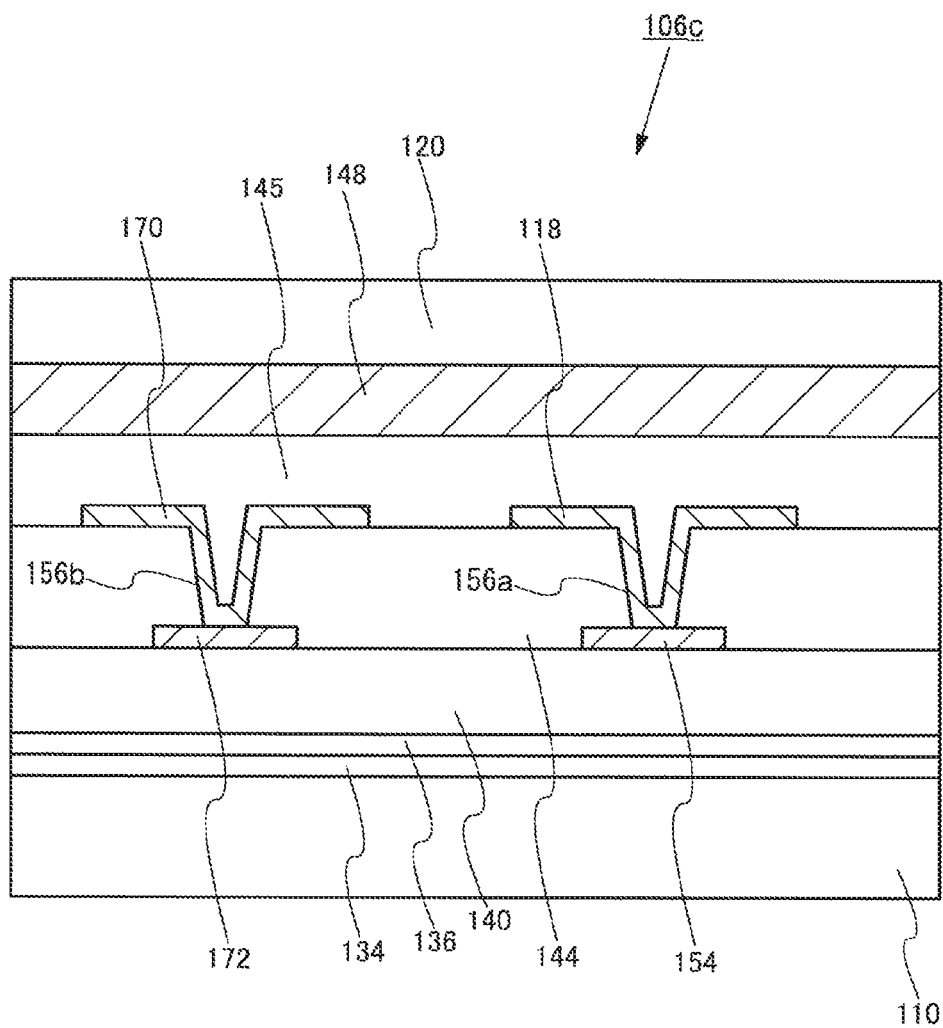
FIG. 13 is a cross-sectional view showing the structure of a light-transmitting part in the display region of the display device with input function according to an embodiment of the present invention.

FIG. 13 shows the details of the cross-sectional structure of the light-transmitting part 106c, and shows an example in which the adjacent shield electrode 170 is provided side by side with the sensor electrode 118. The adjacent shield electrode 170 is connected to the shield wiring 172 by the contact hole 156b provided in the second insulting layer 144, and a potential different from that of the sensor electrode 118 is applied. For example, in the adjacent shield wiring 170, a constant potential (for example, ground potential) is applied. Further, FIG. 13 shows an embodiment in which the adjacent shield electrodes 170 are arranged side by side in the same conductive layer as the sensor electrode 118 (for example, the same conductive layer as the first electrode). In this case, since the adjacent shield electrode is formed of a transparent conductive film such as ITO, ZnO, IZO, and the like, it is possible to prevent the deterioration of transmissivity of the light-transmitting part 106c. As another embodiment, the adjacent shield electrode 170 may be arranged in a different layer than the sensor electrode 118. For example, it may be formed in the same conductive layer as the source/drain electrode further below the sensor electrode 118, the same conductive layer as the gate electrode, or the same conductive layer as the second electrode of the pixel part 104. When the shield electrode 170 is formed of a metallic film, it is preferably formed in a grid shape, comb-tooth shape, or mesh shape pattern and has light-transmissivity.

According to the structure shown in FIG. 13, the adjacent shield electrode 170 is provided in the light-transmitting part 106c, and by maintaining a constant potential (for example, ground potential) and potential fluctuation by providing the same signal as the sensor electrode 118 in the same phase, the influence of the electric field from around the sensor electrode 118 may be reduced. For example, the influence of the electric field by the first electrode 124 and the second electrode 128 in the pixel part 104 may be reduced. For that reason, it is possible to prevent malfunction of the touch sensor and increase sensing sensitivity.

Figure 14:
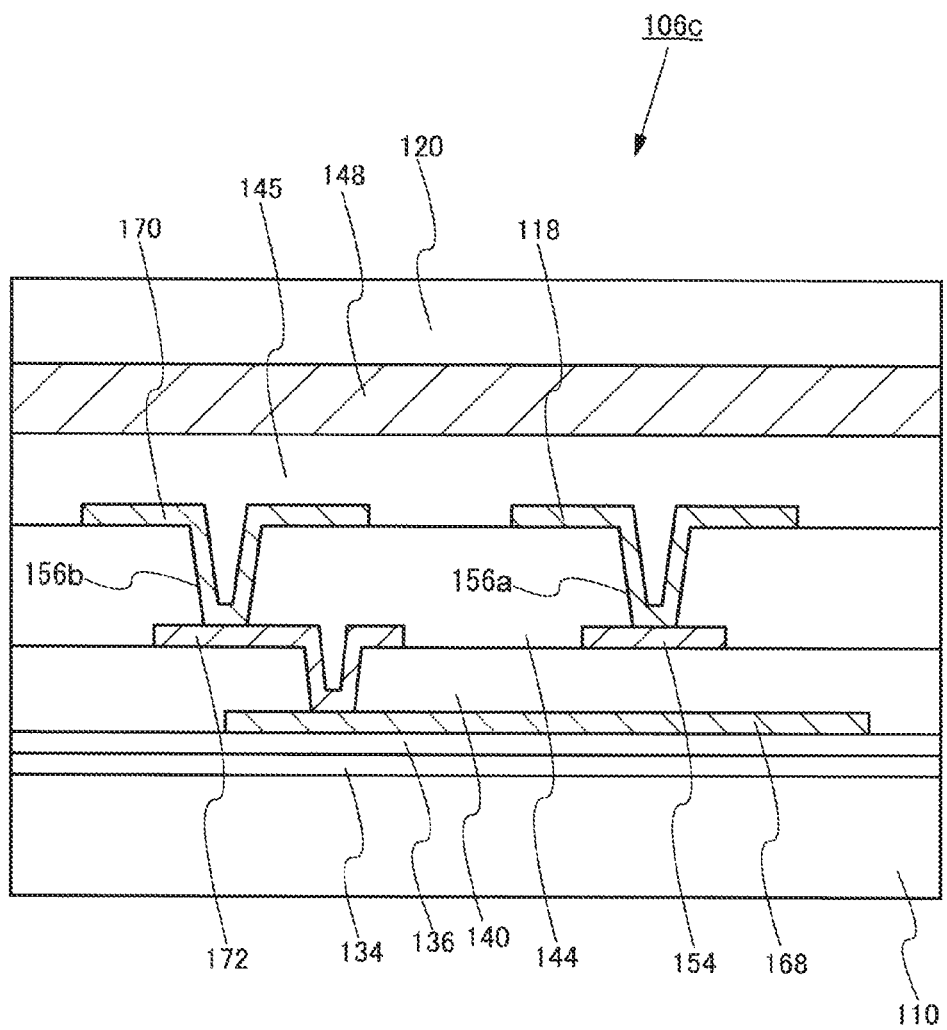
FIG. 14 is a cross-sectional view showing the structure of a light-transmitting part in the display region of the display device with an input function according to an embodiment of the present invention.

FIG. 14 shows an example in which a shield electrode 168 overlapping the sensor electrode 118 via the insulator is added in addition to an adjacent shield electrode 170. The adjacent shield electrode 170 and the sensor electrode 118 are provided above the second insulator 144, and the shield electrode 168 is provided above the gate insulator 136. The shield wiring 172 is provided between the first insulator 140 and the second insulator 144. The shield wiring 172 is connected to the adjacent shield electrode 170 via the contact hole provided between the first insulator 140 and the second insulator 144. The shield wiring 172 is connected to the adjacent shield electrode 170 via the contact hole provided in the second insulator 144 and the shield electrode 168 via the contact hole provided in the first insulator 140.

By applying a constant potential (for example, a fixed potential) from the shield wiring 172, on the surface of the side on which the shield electrode 168 is provided, it is possible to prevent the sensor electrode 118 from detecting changes in capacitance. The potential of the shield wiring 172 may fluctuate between predetermined potentials. For example, a potential may fluctuate in response to operations of the sensor electrode 118. For example, the sensor electrode 118 may be driven so that the potential fluctuates during the sensing operation and non-operation of the touch sensor. In this case, further, by providing the adjacent shield electrode 170, it is possible to reduce the influence of the electric field from around the sensor electrode 118, prevent malfunction of the touch sensor, and increase sensing sensitivity.

Figure 15:
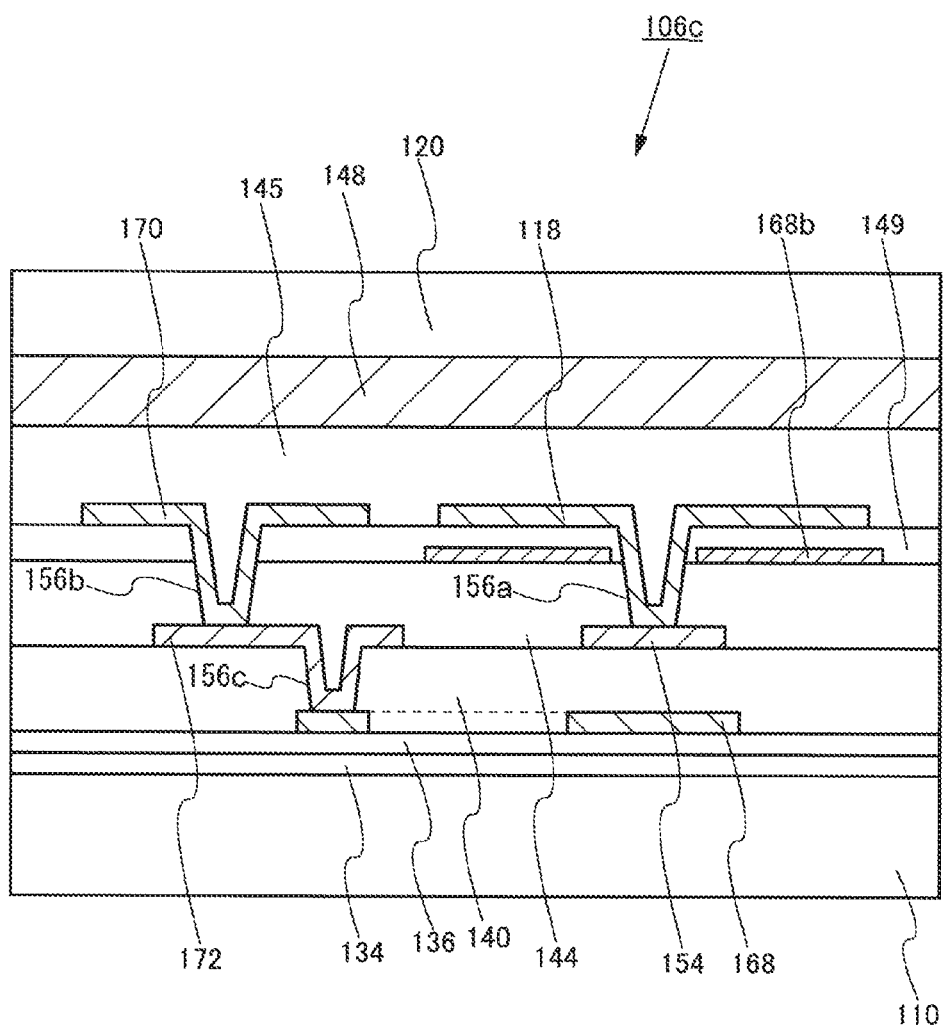
FIG. 15 is a cross-sectional view showing the structure of a light-transmitting part in the display region of the display device with an input function according to an embodiment of the present invention.
Figure 16:
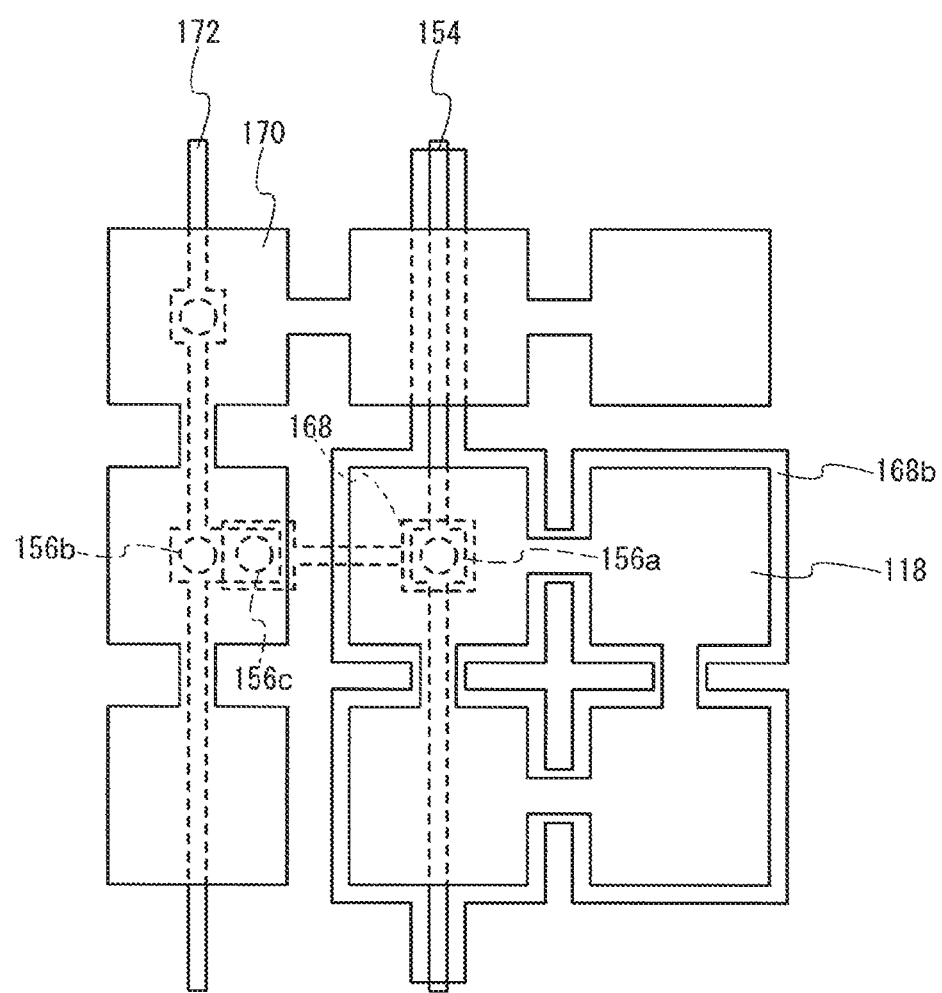
FIG. 16 is a plan view showing the structure of a light-transmitting part in the display region of the display device with an input function according to an embodiment of the present invention.

FIG. 15 shows an example of a cross-sectional view in which a shield electrode 168b overlapping the sensor electrode 118 is provided in addition to the adjacent shield electrode 170. FIG. 16 shows an embodiment as a plan view in which the shield electrode 168b overlapping the sensor electrode 118 is provided in addition to the adjacent electrode 170. The shield electrode 168b is provided in a form substantially resembling the sensor electrode 118 except for the portion overlapping the contact hole. A fifth insulator 149 is provided between the sensor electrode 118 and the shield electrode 168 which are mutually insulated. The sensor electrode 118 and the detection wiring 154 have the same potential, so the shield electrode 168b is preferably provided so as to overlap the sensor electrode 118 as well as the detection wiring 154. The sensor electrode 118 and the shield electrode 168b may be provided adjacently via the fifth insulator 149, so it is possible to increase the electrostatic capacitance maintained by the sensor electrode 118 and in doing so increase detection sensitivity.

Further, the shield electrode 168b cannot cover the contact portion of the sensor electrode 118 and the detection wiring 154, so a shield electrode 168 overlapping that contact portion may be provided. The shield electrode 168 may be electrically connected to the adjacent shield electrodes 170 via the shield wiring 172 by the contact hole 156c provided in the first insulator 140. As is shown in FIG. 15, by not only overlapping the shield electrode 168b but also providing the shield electrode 168 at the contact portion of the detection wiring 154, the electromagnetic shield on both sides of the sensor electrode 118 may be secured. In this way, only one side of the display region may function as the touch sensor surface in a transparent display. In other words, it becomes possible to prevent malfunctions of the touch sensor by touch from the other side (reverse side).

Figure 23:
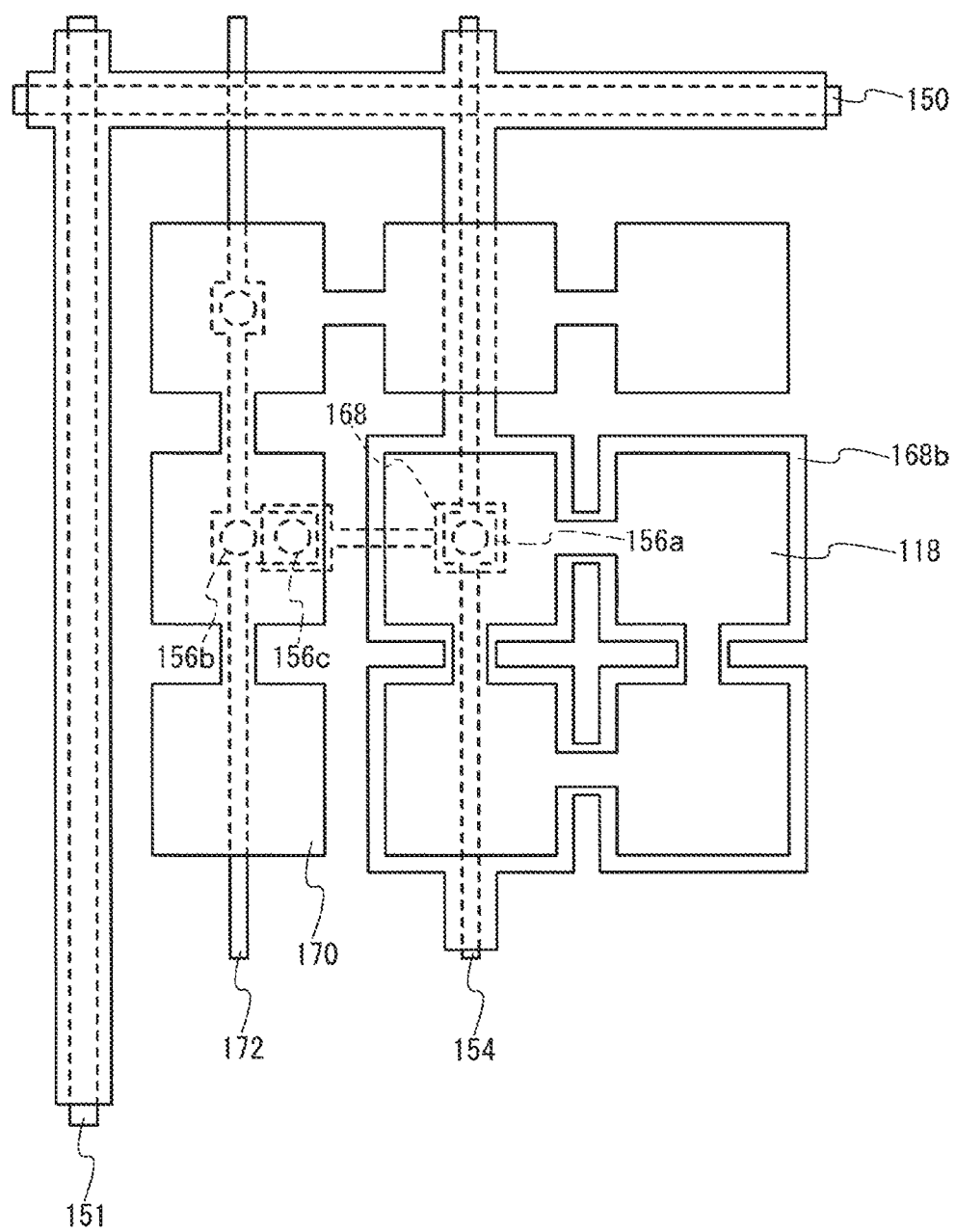
FIG. 23 is a plan view showing the structure of a light-transmitting part in the display region of the display device with an input function according to an embodiment of the present invention.

As is shown in FIG. 23, the shield electrode 168b overlapping the sensor electrode 118 may be provided so as to overlap one of or both the scan line 150 and the data line 151. That is to say, the shield electrode 168b may be provided not only in the region overlapping the sensor electrode 118, but also in the region in which the scan line 150 and the data line 151 are arranged. By such a structure, it is possible to prevent the influence of the electromagnetic field by the scan line 150 and the data line 151 on the sensor electrode 118. In this case, the scan line 150 and the data line 151 overlapping the shield electrode 168b may synchronize with the timing of sensing operations of the touch sensor, and provide a signal with the same potential as the shield electrode 168b.

Modified Example 1

In embodiment 1, a shield electrode 168b as shown in FIG. 15 and FIG. 16 may be provided overlapping the sensor electrode 118 shown in FIG. 7. Since the sensor electrode 118 is shielded from the scan line 150 and the data line 151 by the shield electrode 168b, the influence of the electromagnetic field from theses signal lines is reduced. The scan line 150 and the data line 151 which overlap the shield electrode 168b synchronize with the timing of the sensing operation of the touch sensor, and it is possible to reduce the influence of parasitic capacitance by providing a signal with the same potential as the shield electrode 168b.

Embodiment 4

The present embodiment exemplifies a structure as the display device with an input function in which it is possible to detect touch from both sides of the display region.

Figure 17A:
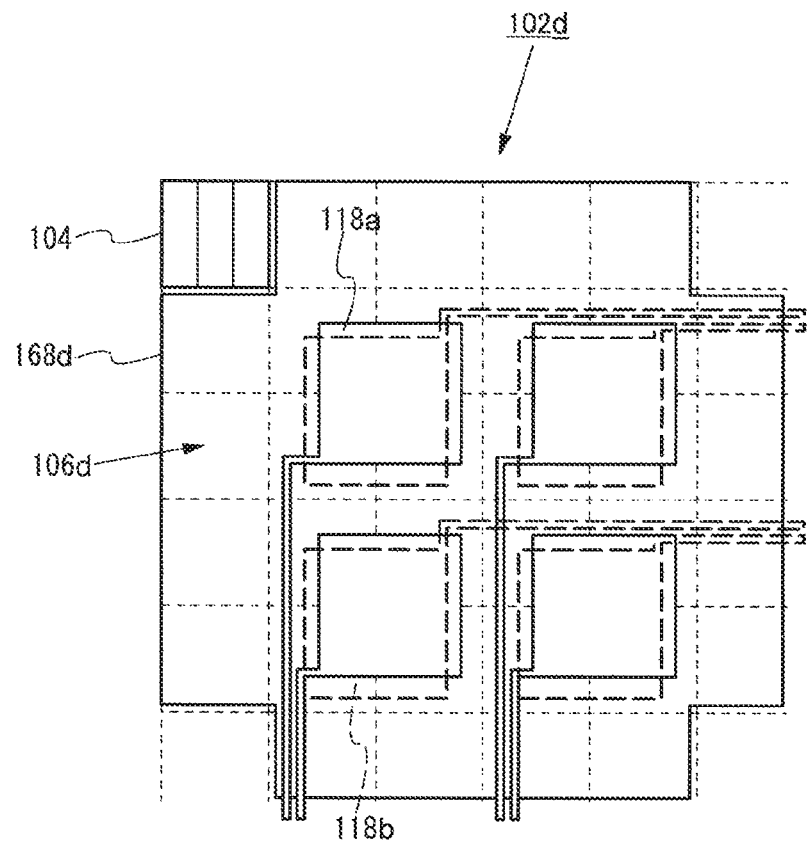
FIG. 17A is a plan view showing the structure of the display device with an input function according to an embodiment of the present invention.

FIG. 17A shows an embodiment of the pixel part 104 and the light-transmitting part 106d in the display region 102d. Here, the structure of the pixel part 104 and the relationship of the arrangement of the pixel part 104 and the light-transmitting part 106d is the same as that of embodiment 1. The light-transmitting part 106d includes a sensor electrode 118 and a shield electrode 168d. The shield electrode 168d is provided on substantially the entire surface of the light-transmitting part 106d. The shield electrode 168d is provided on substantially the entire surface of the light-transmitting part 106d. The first sensor electrode 118a sandwiches the shield electrode 168d and is provided on one side of the light-transmitting part 106d, and the second sensor electrode 118b sandwiches the seal and the shield electrode 168d and is provided on the other side of the light-transmitting part 106d. By providing the first sensor electrode 118a and the second sensor electrode 118b sandwiching the shield electrode 168d, it becomes possible to sense touch separately.

Figure 17B:
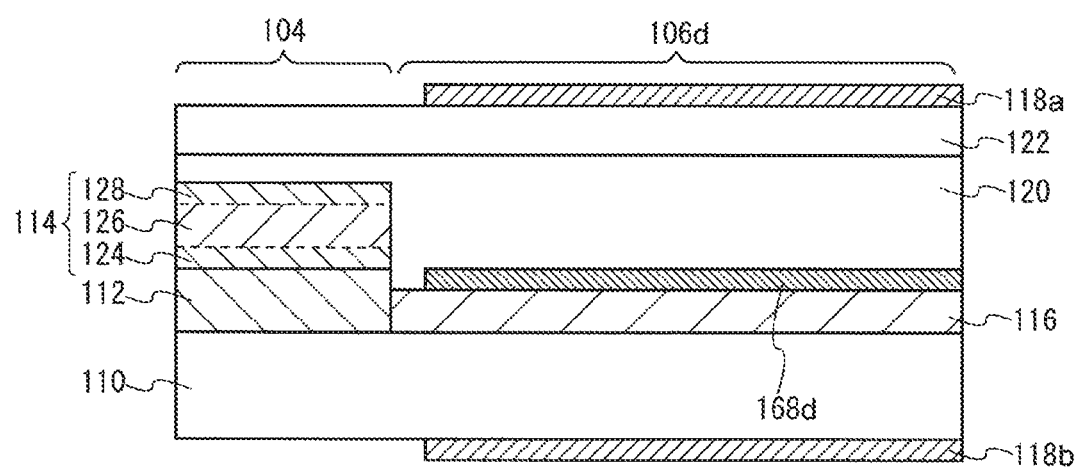
FIG. 17B is a cross-sectional view showing the structure of the display device with an input function according to an embodiment of the present invention.

FIG. 17B schematically shows the cross-sectional structure of the display region 102d. In the light-transmitting part 106d, the shield electrode 168d is provided between the insulator 116 and the sealant 120. The first sensor electrode 118a is provided on the second substrate 122 provided above the sealant 120. The second sensor electrode 118b is provided on the second side of the first substrate 110a. In this way, the first sensor electrode 118a is provided on one side of the display region 102d, the second sensor electrode 118b is provided on other sides of the display region 102d, and by providing the shield electrodes inside the panel, it is possible to detect different touches on both sides of the display region 102d. In other words, the shield electrode 168 is provided between the first substrate 110 and the second substrate 122, and the first sensor electrode 118a and the second sensor electrode 118b are provided so as to sandwich this shield electrode 168, so it is possible to detect different touches on both sides of the display region 102d. That is to say, it is possible to provide the touch sensor surface on two sides. In this way, it is possible to accept different touch inputs on one side and the other side of the display region 102d. Further, although the first sensor electrode 118a is provided on the outside surface of the second substrate 122, it is not limited to this embodiment, for example, the first sensor electrode 118a may be provided on the inside surface of the second substrate 122 (the surface of the sealant 120 side).

Further, when the potential of the shield electrode 168d is fixed at a predetermined potential (for example, a ground potential), the first sensor electrode 188a and the second sensor electrode 118b are preferably driven in reverse phase. When the potential of the shield electrode 168d synchronizes with the drive of the sensor electrode and changes, the first sensor electrode 118a and the second sensor electrode 118b may be driven in phase.

Figure 24A:
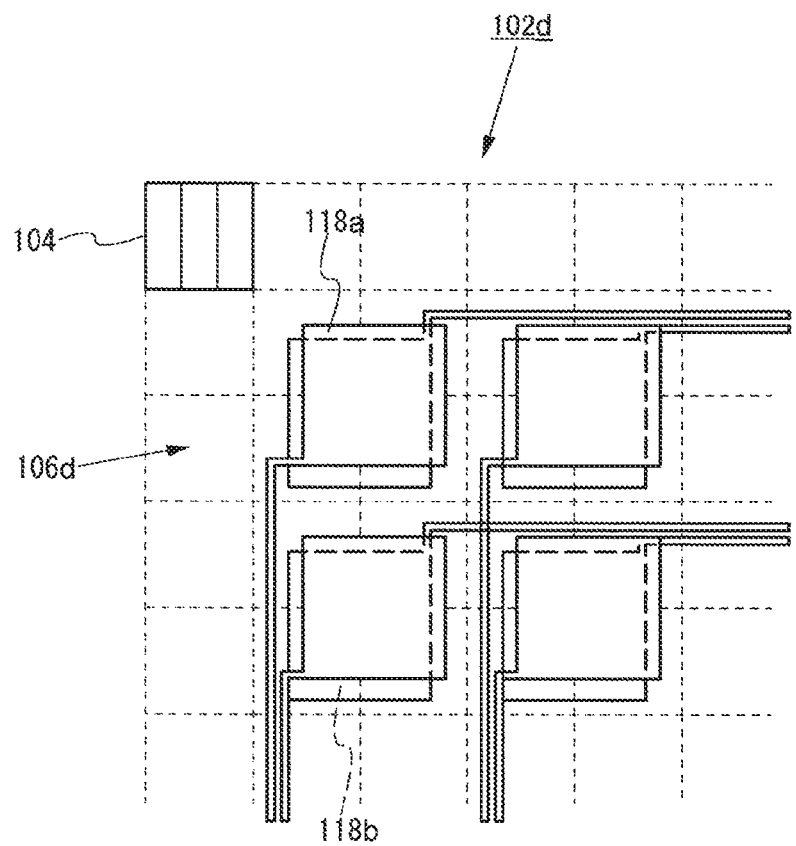
FIG. 24A is a plan view showing the structure of the display device with an input function according to an embodiment of the present invention.
Figure 24B:
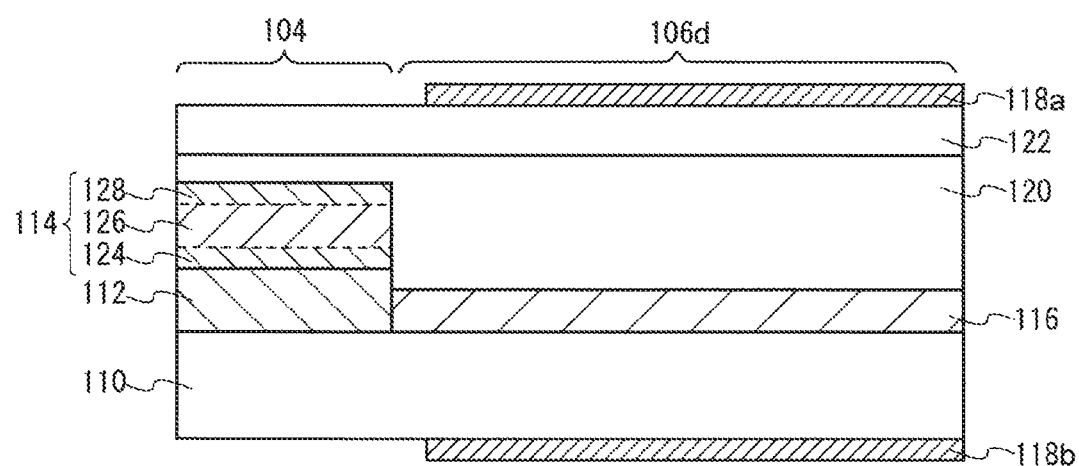
FIG. 24B is a cross-sectional view showing the structure of the display device with an input function according to an embodiment of the present invention.

FIG. 24A and FIG. 24B show a structure in which the shield electrode 168d provided between the sensor electrode 118a and the sensor electrode 118b shown in FIG. 17A and FIG. 17B is omitted. FIG. 24A shows a cross-sectional view of the light-transmitting part 106d, and the sensor electrode 118a and the sensor electrode 118b are provided so as to overlap in substantially the same location in a plan view. FIG. 24B schematically shows the cross-sectional structure of the display region 102d, and an embodiment in which the sensor electrode 118a and the sensor electrode 118b are provided so as to sandwich the insulator 116, the sealant 120, and the second substrate 122. In such a structure, during the sensing operation of the touch sensor, when one of the sensor electrodes operates as a sensor, the predetermined fixed potential is provided to the other sensor electrode which is used as an electromagnetic shield, and in the timing of the next sensing, one of the sensor electrodes is used as an electromagnetic shield, and the other sensor electrode operates as a sensor, so different touch inputs may be accepted on one side and the other side of the display region 102d. According to the structure of FIG. 24A and FIG. 24B, when both sides of the display region are touch sensor surfaces, it becomes possible to omit a shield electrode between the sensor electrode 118a and the sensor electrode 118b, and simplify the structure of the display panel.

Modified Example 2

Figure 18:
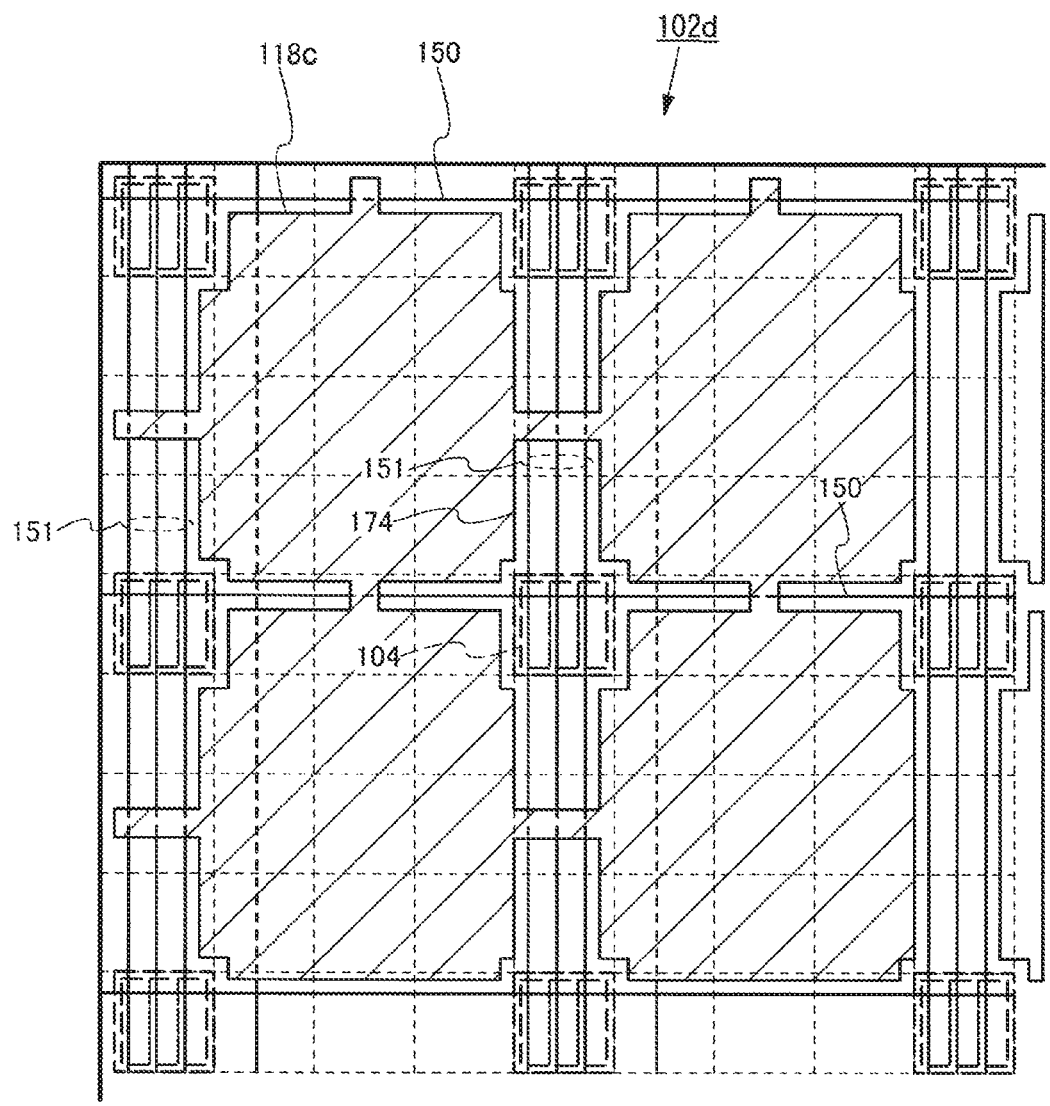
FIG. 18 is a plan view showing the structure of the display region of the display device with an input function according to an embodiment of the present invention.

FIG. 18 shows an example of a sensor electrode 118c which may be applied as the first sensor electrode and the second sensor electrode of the present embodiment. In the touch panel, the density of the sensor electrode is less than the density of the pixel. Because of this, the sensor electrode shown in FIG. 18 has a pattern expanding throughout the plurality of pixel parts 104 as is illustrated. In this case, the pattern of the sensor electrode 118c preferably has an opening in which the region of the pixel part 104 is opened. In the sensor electrode 118c provided with a solid pattern, parasitic capacitance becomes a problem when the scan line and the data line overlap, so openings are preferably provided in the regions overlapping these signal lines (intermediate region 107a, 107b). In other words, one of or both the first sensor electrode 118a and the second sensor electrode 118b are provided with a plurality of light-transmitting parts so as to surround at least one pixel part 104 among a plurality of pixel parts, and may be provided so as to include an opening 174 for opening one pixel part 104.

FIG. 18 shows an embodiment having an opening 174 in the region in which the sensor electrode 118c, the pixel part 104, and the intermediate region 107a, 107b overlap. When the entire intermediate region 107a, 107b is open, the pattern of the sensor electrode separates, so a joining section is provided in the opening 174 so as to connect adjacent patterns. In this way, by using the pattern of the sensor electrode 118c including a plurality of pixel parts 104, the sensitivity of the touch sensor may be increased.

Further, in embodiment 4, as is shown in FIG. 23, a shield electrode 168b overlapping the sensor electrode 118c is provided, and one of or both the scan 150 and the data line 151 are provided so as to overlap, so the opening 174 may be omitted. That is to say, the shield electrode 168b may be provided not only in the region overlapping the sensor electrode 118, but also extending to the region in which the scan 150 and the data line 151 are arranged, so the influence of the electromagnetic field by the data line 151 on the sensor electrode 118 may be prevented. In this case, the scan 150 and the data line 151 overlapping the shield electrode 168b synchronize with the timing of the sensing operation of the touch sensor, and the influence of parasitic capacitance may be reduced by providing a signal of the same potential as the shield electrode 168b.

According to the present embodiment, at least a shield electrode 168d is provided in the light-transmitting part 106, and sensor electrodes (first sensor electrode 118a, second sensor electrode 118b) are provided on both sides so as to sandwich the shield electrode 168d, so a display device with an input function in which touch sensing can be performed separately on both sides of the display region 102d may be realized. The structure of the sensor electrodes according to the present embodiment may be implemented by appropriately combining embodiments 1 through 4.

Embodiment 5

The present embodiment shows an example of a display device with an input function including a mutual capacitance type touch sensor.

The present embodiment shows an example of a display device with an input function having a mutual capacitance type touch sensor. The display device with an input function in the present embodiment has a pixel part and a light-transmitting part in the same display region as embodiment 1.

Figure 19A:
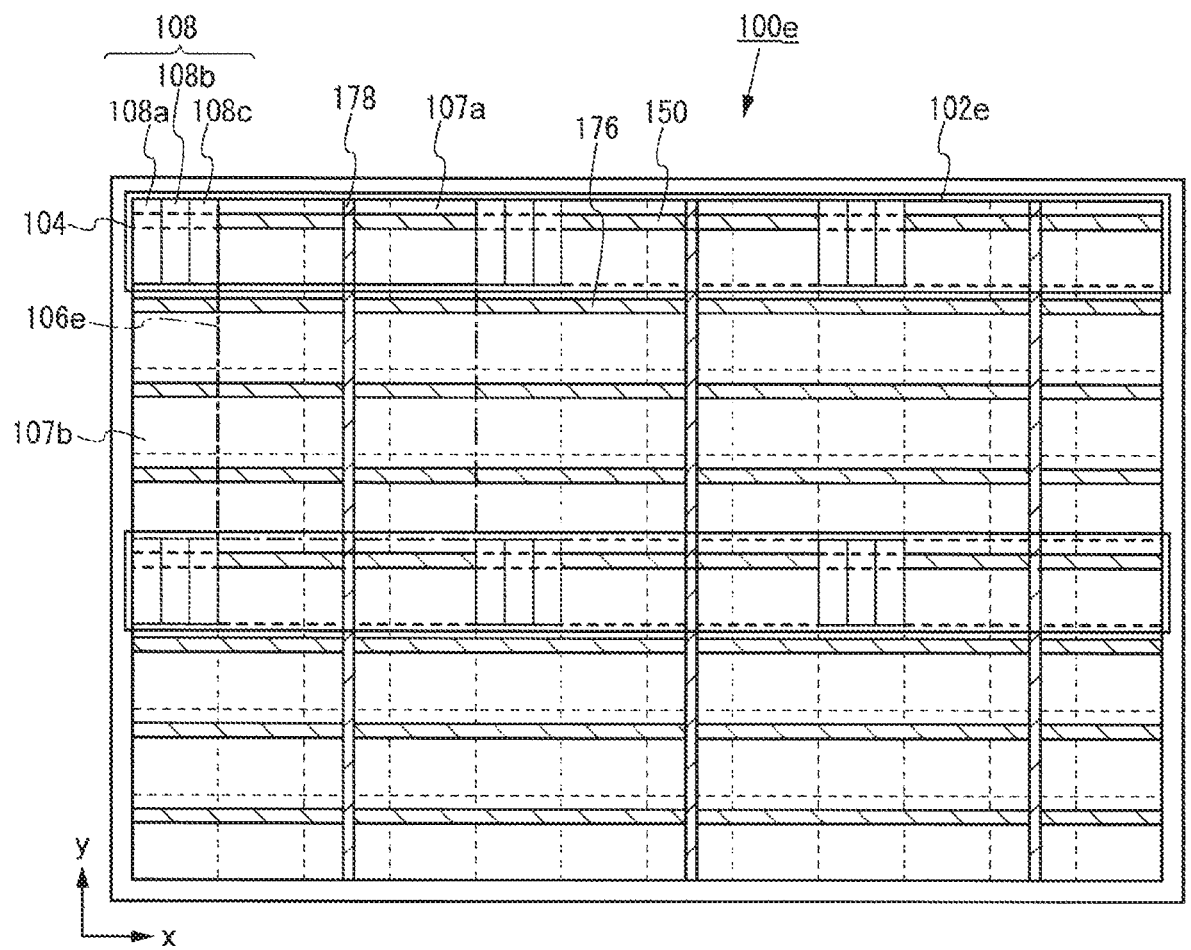
FIG. 19A is a plan view showing the structure of the display device with an input function according to an embodiment of the present invention.

FIG. 19A shows a display device with an input function 100e according to the present embodiment. The display device with an input function 100e includes a pixel part 104 and a light-transmitting part 106e in the display region 102e. The structure of the pixel part 104 is the same as that of embodiment 1. The display region 102e includes an intermediate region 107a in the array of pixel parts 104 in the x direction in which pixel parts are not provided, and an intermediate region 107b in the array of pixel parts 104 in the y direction in which pixel parts are not provided. A scan line is provided in the intermediate region 107a and a data line is provided in the intermediate region 107b.

The light-transmitting part 106e is provided with a first sensor electrode 176 (Tx electrode) extending in a first direction and a second sensor electrode 178 (Rx electrode) extending in a second direction intersecting the first direction. The first sensor electrode 176 extends from one end of the display region 102e including the intermediate region 107b and the light-transmitting part 106e to the other end (in the x direction). The second sensor electrode 178 extends from one end of the display region 102e including the intermediate region 107a and the light-transmitting part 106e to the other end (in the y direction). The first sensor electrode 176 and the second sensor electrode 178 intersect but are provided in different layers from each other. For example, the first sensor electrode 176 is provided in the same layer as the scan line, and the second sensor electrode 178 is provided in the same layer as the data line. In the display region 102e, because the pixel part 104 in which the scan line is arranged and the intermediate region 107a are provided side by side with the light-transmitting part 106e, the first sensor electrode 176 and the scan line may be arranged so as not to interfere. Similarly, because the pixel part in which the data line is provided and the intermediate region 107b are provided side by side with the light-transmitting part 106e, the data line and the second sensor electrode 178 are arranged so as not to interfere. In this way, a mutual capacitance type touch sensor may be configured by the first sensor electrode 176 and the second sensor electrode 178.

Figure 19B:
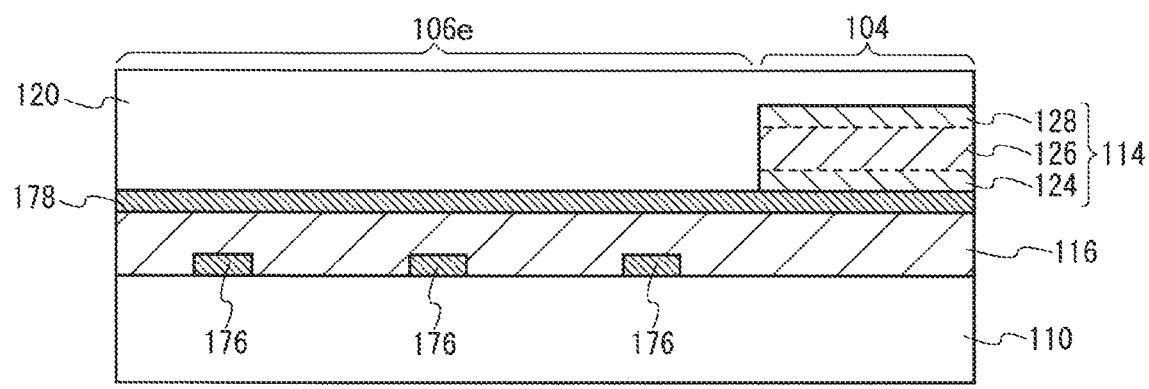
FIG. 19B is a plan view showing the structure of the display device with an input function according to an embodiment of the present invention.

FIG. 19B schematically shows a cross-sectional structure of the pixel part 104 and the light-transmitting part 106e. In the light-transmitting part 106e, the first sensor electrode 176 and the second sensor electrode 178 are provided sandwiching the insulator 116. As described above, it is possible to form the first sensor electrode 176 and the second sensor electrode 178 by wiring included in the circuit element layer 112.

The first sensor electrode 176 and the second sensor electrode 178 are arranged intersecting so as to form a matrix. In a mutual capacitance type touch sensor, a pulse signal is provided to the first sensor electrode 176 (Tx electrode) and forms an electric field between the first sensor electrode 176 and the second sensor electrode 178 (Rx electrode). When the body (fingertips) comes close, the electric field is disturbed, the electric field detected by the second sensor electrode 178 decreases, and electrostatic capacitance is reduced. In a mutual capacitance type touch sensor, change in electrostatic capacitance is captured and a touch state is determined.

Figure 20:
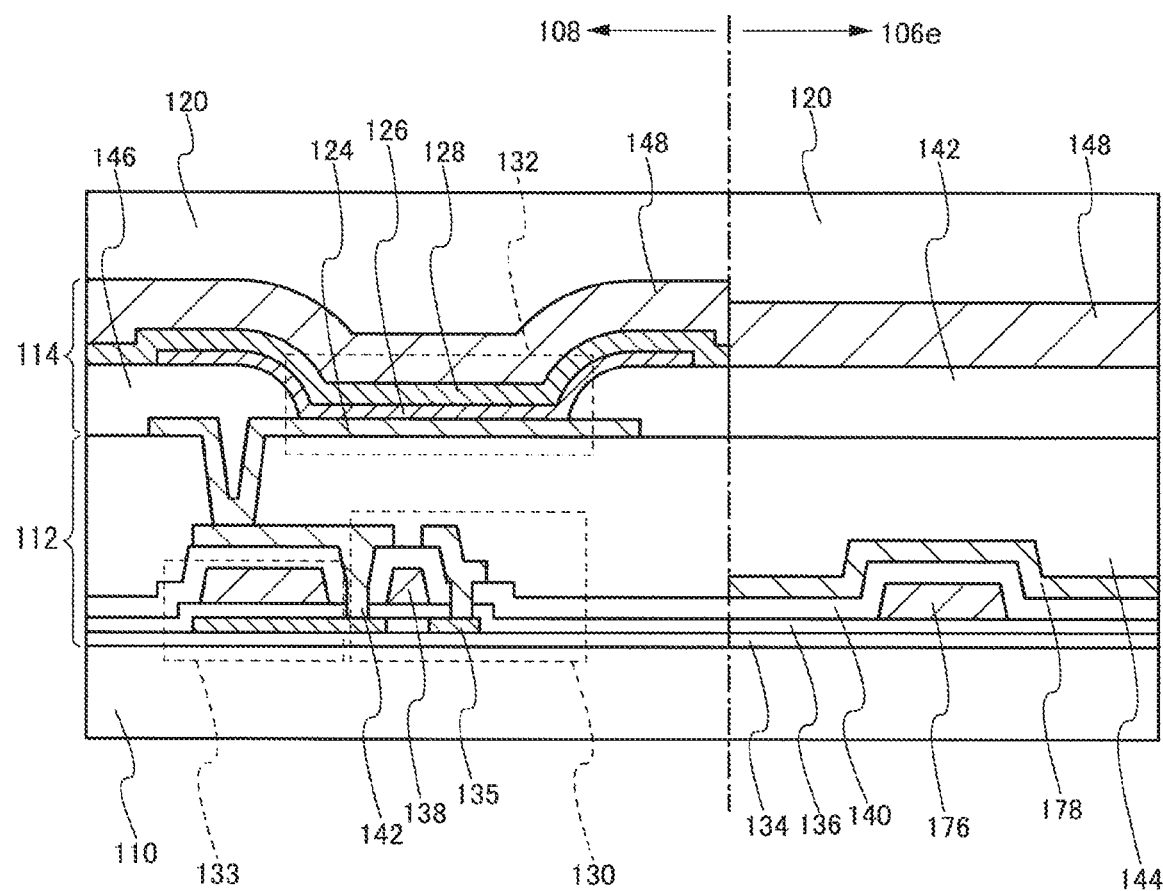
FIG. 20 is a cross-sectional view showing the structure of a pixel of the display device with an input function according to an embodiment of the present invention.

FIG. 20 shows the cross-sectional structure of the pixel part 104 and the light-transmitting part 106e. The structure of the pixel part 104 is the same as is shown in FIG. 3 in embodiment 1. The first sensor electrode 176 and the second sensor electrode 178 are provided in the light-transmitting part 106e. The first sensor electrode 176 is, for example, formed by the same conductive layer as the gate electrode 138. The second sensor electrode 178 is formed by the same conductive layer as the source/drain electrode 142. The first insulator 140 is provided between the first sensor electrode 176 and the second sensor electrode 178. Because of this, even in the intersecting portion of the first sensor electrode 176 and the second sensor electrode 178, both signal lines may be provided so as not to short circuit. Because the gate insulator 136 is provided below the first sensor electrode 176, and the second insulator and the third insulator 146 are provided above the second sensor electrode 178, these sensor signal lines may be embedded in the insulators. By such a structure, even in the region in which the touch sensor is formed, sensor signal lines used as the Tx electrode and the Rx electrode are protected.

Further, although FIG. 20 shows an embodiment in which the first sensor electrode 176 is formed in the same layer as the gate electrode, the present embodiment is not limited to this, and another conductive layer (for example, a conductive layer forming the source/drain electrode) may be used. The second sensor electrode 178 may be formed in the same layer as the first electrode of the light-emitting element 132. For example, by forming the first sensor electrode 176 in the same conductive layer as the gate electrode 138 and forming the second sensor electrode 178 in the same conductive layer as the first electrode 124, the first insulator 140 and the second insulator 144 exist between both sensor signal lines, and it is possible to reduce parasitic capacitance in the intersecting portion. Not limited to the wiring structure shown in FIG. 20, when the circuit element layer 112 further has a multiple layer wiring structure, it is possible to use wire layers provided in different layers, and provide a first sensor electrode 176 and the second sensor electrode 178 in the light-transmitting part 106e.

According to the structure of the touch sensor of the present embodiment, it is possible to sense touch from one side and the other side of the display region 102e. That is to say, it is possible to use both sides of the display region 102e as the touch surface of the touch sensor.

On the other hand, as is shown in FIG. 11, the shield electrode 168 may be provided on the first substrate 110. In this case, the shield electrode 168 is provided in at least the region overlapping the light-transmitting part 106e. Because the shield electrode 168 is provided on the first substrate 110, it is possible to securely prevent the first sensor electrode 176 and the second sensor electrode 178 from reacting to touch from the side of the shield electrode 168. In this way, a touch sensor sensitive to touch on one side may be provided.

In this way, according to the present embodiment, in a case in which a mutual capacitance type touch sensor is provided in a transparent display, when an electrode of the touch sensor is provided, a layer included in the circuit element layer 112 of the pixel part 104 is used and a sensor signal line may be provided without adding a new conductive layer. That is to say, by arranging the pixel part 104 and the light-transmitting part 106e side by side and providing the sensor signal line in the light-transmitting part 106e, the number of stacked layers of wiring decreases, and it is possible to aim for a thinner, lighter, and lower-cost display device with an input function.

Embodiment 6

The present embodiment shows an embodiment different from embodiment 5 in the display device with an input function having a mutual capacitance type touch sensor. In the present embodiment, a structure in which different touch inputs are possible on one side and the other side of the display region is shown.

Figure 21A:
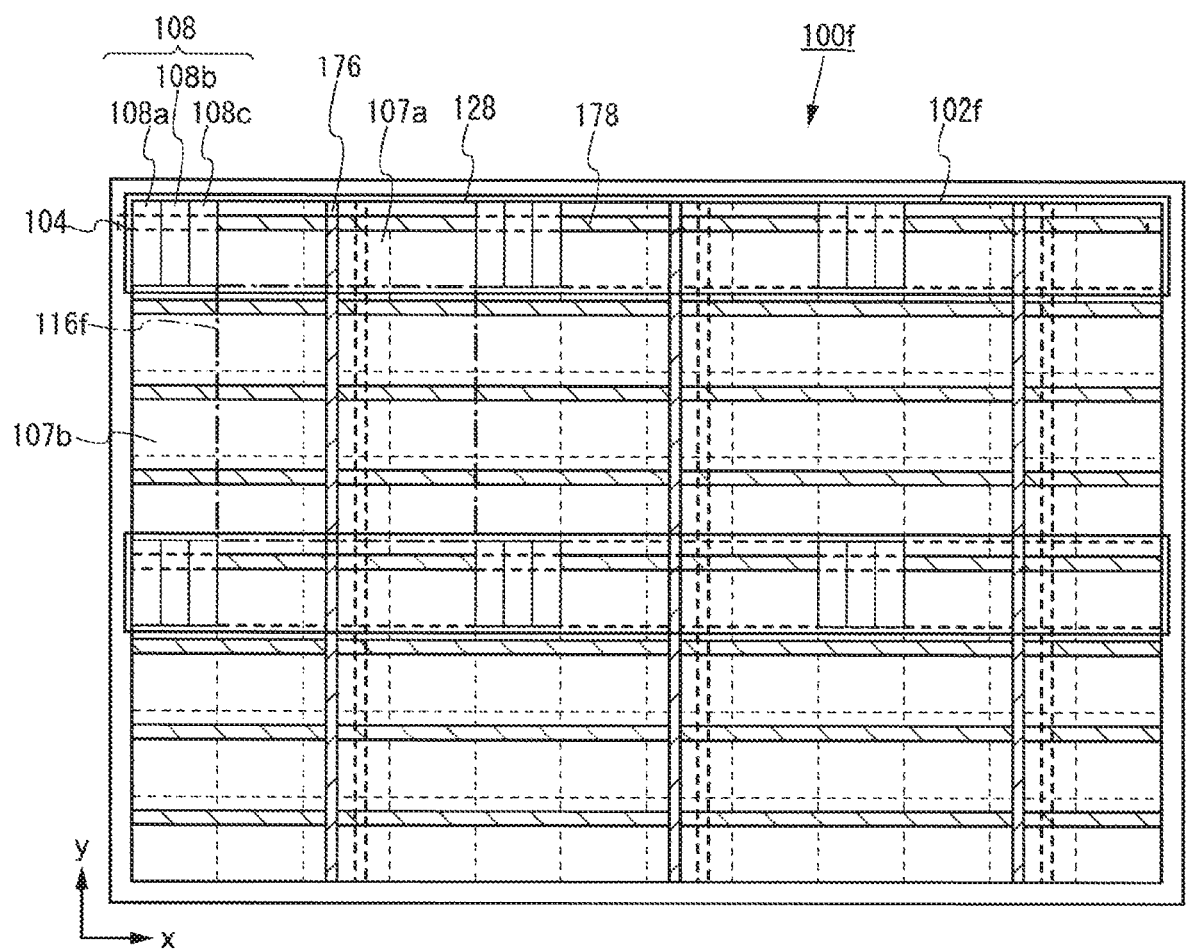
FIG. 21A is a plan view showing the structure of the display device with an input function according to an embodiment of the present invention.

FIG. 21A shows the display device with an input function 100f according to the present embodiment. The display device with an input function 100f includes a pixel part 104 and a light-transmitting part 106f in the display region 102f. In the light-transmitting part 106f, a first sensor electrode 118 extending in a first direction (Tx electrode), and a second sensor electrode 178a (Rx electrode) and a second sensor electrode 178b (Rx electrode) extending in a second direction intersecting the first direction are provided. The first sensor electrode 176 is arranged in an x direction shown in the drawings, and the second sensor electrode 178a and the second sensor electrode 178b are both arranged in a y direction. The second sensor electrode 178a and the second sensor electrode 178b are provided on one side and the other side of the display region 102f. Although FIG. 21A shows an embodiment in which the second sensor electrode 178a and the second sensor electrode 178b are arranged parallel in a horizontal direction, this is merely an example, and the second sensor electrode 178a and the second sensor electrode 178b may be arranged so as to sandwich the display region 102f and overlap.

Figure 21B:
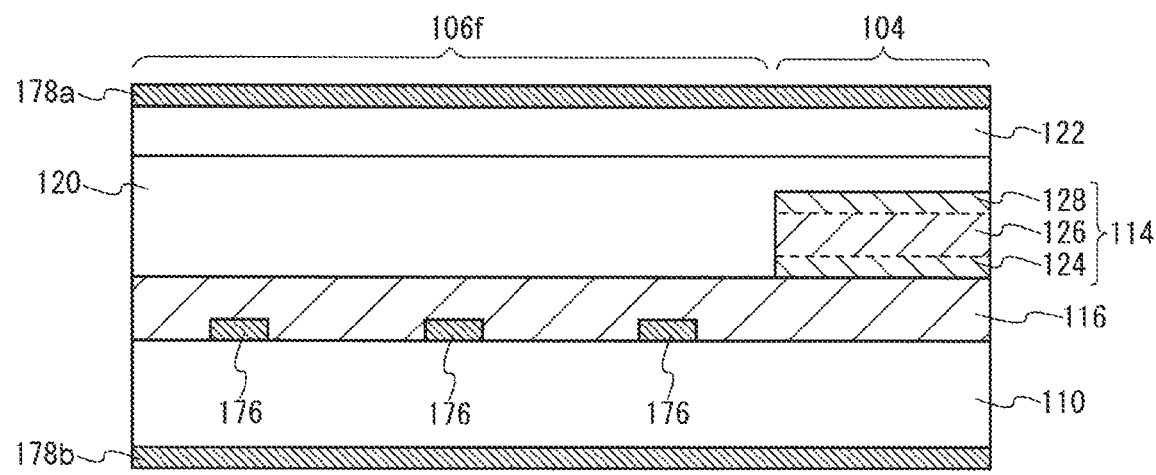
FIG. 21B is a plan view showing the structure of the display device with an input function according to an embodiment of the present invention.

FIG. 21B schematically shows a cross-sectional structure of the pixel part 104 and the light-transmitting part 106f. In the light-transmitting part 106f, the first sensor electrode 176 is embedded above the insulator 116 or in the insulator 116. On the other hand, the second sensor electrode 178a is provided on the second side of the first substrate 110, and the second sensor electrode 178b is provided on the second substrate 122 provided above the sealant 120. By sandwiching the first sensor electrode 176 operating as the Tx line and providing the second sensor electrode 178a and the second sensor electrode 178b operating as the Rx line, the first sensor electrode 118 is shared and a touch surface of the touch sensor may be provided on both sides of the display region 102f. That is to say, the first sensor electrode 176 is used as a transmitting electrode, and the timing of the sensing of the second sensor electrode 178a and the second sensor electrode 178b used as the receiving electrodes is delayed, so detection of each touch on one side and the other side of the display region 102f may be performed.

Figure 22:
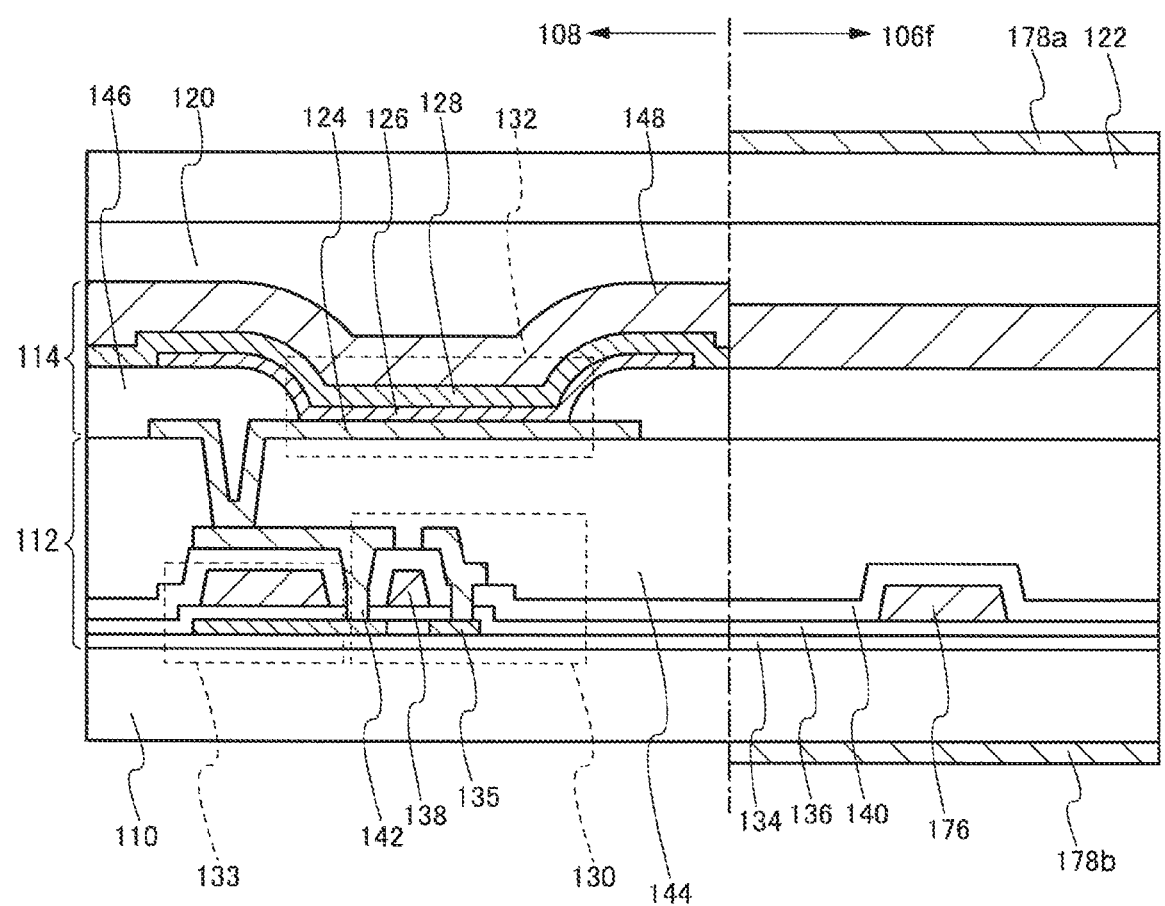
FIG. 22 is a cross-sectional view showing the structure of a pixel of the display device with an input function according to an embodiment of the present invention.

FIG. 22 shows a cross-sectional structure of the pixel part 104 and the light-transmitting part 106f. In the light-transmitting part 106f, the first sensor electrode 176 is, for example, formed in the same conductive layer as the gate electrode 138. The second sensor electrode 178a is provided on one side of the first substrate 110, and the second sensor electrode 178b is provided on one side of the second substrate 122. The second sensor electrode 178a and the second sensor electrode 178b are provided so that at least one portion overlaps the light-transmitting part 106. However, the second sensor electrode 178a and the second sensor electrode 178b are preferably formed of a transparent conductive film so as to have light-transmissivity. Further, the first sensor electrode 176 used as the Tx electrode is not limited to the conductive layer forming the gate electrode, and it is possible to use the conductive layer forming the source/drain electrode, and the conductive layer forming the electrode of the light-emitting element 132 (first electrode 124, second electrode 128). In the display region according to the present invention, since the light-transmitting part 106 is arranged adjacent to the pixel part 104, when the circuit element layer 112 of the pixel part 104 is multi-layer wiring, another conductive layer including the multi-layer wiring may be used.

According to the present invention, wiring for transmission is provided inside the display panel, and wiring for receiving is provided on both sides of the display panel so as to sandwich that wiring, so the touch panel may be configured so as to have touch surfaces on both sides of the display region.

INDUSTRIAL APPLICABILITY

The display device with an input function according to an embodiment of the present invention is suitable for use as digital signage (electronic signage or electronic billboard), a guide plate in a commercial setting, and a guide plate in public facilities such as airports, railroads, buses, and the like.

What is claimed is:

1. A display device comprising:
a first substrate having light-transmissive property;
a display region on the first substrate;
a plurality of pixel parts arranged in the display region, each of the plurality of pixel parts including at least one pixel; and
a light-transmitting part arranged in the display region;
wherein the plurality of pixel parts include a first pixel part, a second pixel part, a third pixel part, and a fourth pixel part,
wherein the second pixel part is arranged in a first direction from the first pixel part, the third pixel part is arranged in a second direction intersecting the first direction from the first pixel part, and the fourth pixel part is arranged in the first direction from the third pixel part and in the second direction from the second pixel part,
wherein the light-transmitting part includes:
a first intermediate region between the first pixel part and the second pixel part in the first direction,
a second intermediate region between the third pixel part and the fourth pixel part in the first direction,
a third intermediate region between the first pixel part and the third pixel part in the second direction,
a fourth intermediate region between the second pixel part and the fourth pixel part in the second direction, and
a region surrounded by the first to fourth intermediate region,
wherein a length in the first direction of the region is greater than a length in the first direction of the third intermediate region, and
wherein a length in the second direction of the region is greater than a length in the second direction of the first intermediate region.

2. The display device according to claim 1,
wherein the length in the first direction of the region is greater than a length in the first direction of the first pixel part, and the length in the second direction of the region is greater than a length in the second direction of the first pixel part.

3. The display device according to claim 1,
wherein the pixel includes a light emitting element, the light-emitting element includes a first electrode, and a second electrode, and a light-emitting layer between the first electrode and the second electrode.

4. The display device according to claim 1, further comprising:
a sealant over the plurality of the pixel part and the light-transmitting part,
wherein a thickness of the sealant of the light-transmitting part is greater than that of the sealant of the pixel parts.

5. The display device according to claim 3, further comprising:
a sensor electrode provided in the region.

6. The display device according to claim 5, further comprising:
a vertical drive circuit for outputs scans data signals, a horizontal drive circuit outputs for a synchronizing signal, a scanning line, a data line, and a detection wiring,
wherein the vertical drive circuit and the horizontal drive circuit are outside the display region,
wherein the display region includes the scanning line extending in the first direction and the data line extending in the second direction,
wherein the detection wiring arranged almost parallel to the scanning line or the data line, and
wherein the scanning line electrically connected to the vertical drive circuit, the data line electrically connected to the horizontal drive circuit, and the detection wiring electrically connected to the sensor electrode.

7. The display device according to claim 5, further comprising:
a first shield electrode is provided in the region, the first shield electrode is provided between the sensor electrode and the first substrate.

8. The display device according to claim 5, further comprising:
a second shield electrode is provided in the region, the second shield electrode is a same layer of the sensor electrode, and provided along at least one side of the sensor electrode.

9. The display device according to claim 1, further comprising:
a first sensor electrode, an insulator, and a second sensor electrode stacked in this order in the region.

10. The display device according to claim 9, further comprising:
a circuit element layer including a transistor in which a semiconductor layer, a gate insulator and a gate electrode are stacked, and a wiring connected to the transistor;

wherein the first sensor electrode is provided in the same layer as the gate electrode, and the second sensor electrode is provided in the same layer as the wiring connected to the transistor.

11. The display device according to claim 9,
wherein the display region includes a scanning line extending in the first direction and a data line extending in the second direction intersecting the first direction, and
wherein the first sensor electrode is arranged in the same layer as the scanning line, and the second sensor electrode is arranged in the same layer as the data line.

12. The display device according to claim 9,
wherein either the first sensor electrode or the second sensor electrode is a transmitting electrode, and the other is a receiving electrode.

13. The display device according to claim 1, further comprising:
a second substrate having a light-transmitting opposed to the first substrate;
a first sensor electrode arranged on the first substrate;
a second sensor electrode arranged on the second substrate; and
a shield electrode arranged in the light-transmitting part between the first substrate and the second substrate,
wherein the first sensor electrode and the second sensor electrode sandwich the shield electrode.

14. The display device according to claim 1,
wherein each of the first to fourth pixel parts includes a first pixel, second pixel adjacent to the first pixel in the first direction, and third pixel adjacent to the second pixel in the first direction.

15. The display device according to claim 14,
wherein in the first direction, a width of the first intermediate is greater than a width of the first pixel, and a length of the third intermediate region is greater than a length of the first pixel.

* * * * *